United States Patent [19]

Yamamura et al.

[11] Patent Number: 5,365,480
[45] Date of Patent: Nov. 15, 1994

[54] MEMORY CELLS AND A MEMORY APPARATUS USING THEM

[75] Inventors: Kouichirou Yamamura; Kenichi Toyota; Yoshihiko Kawano, all of Tokyo, Japan

[73] Assignee: NEC Corporation, Tokyo, Japan

[21] Appl. No.: 67,982

[22] Filed: May 27, 1993

[30] Foreign Application Priority Data

May 28, 1992 [JP]  Japan .................. 4-160113
Nov. 18, 1992 [JP]  Japan .................. 4-332504

[51] Int. Cl.⁵ ............................................ H01L 27/11
[52] U.S. Cl. ............................ 365/190; 365/177; 365/189.08; 365/188; 365/63
[58] Field of Search ........... 365/190, 154, 202, 189.01, 365/189.05, 230.01, 230.06, 63, 72, 189.08

[56] References Cited

U.S. PATENT DOCUMENTS

| | | | |
|---|---|---|---|
| 4,779,226 | 10/1988 | Haraszti | 365/190 |
| 4,805,148 | 2/1989 | Diehl-Nagle et al. | 365/190 |
| 4,845,674 | 7/1989 | Vu | 365/154 |
| 4,845,676 | 7/1989 | Lohlein et al. | 365/190 |
| 4,933,899 | 6/1990 | Gibbs | 365/177 |
| 4,995,001 | 2/1991 | Dawson et al. | 365/154 |
| 5,040,146 | 8/1991 | Mattausch et al. | 365/190 |

FOREIGN PATENT DOCUMENTS

54-144834 11/1979 Japan .
58-211392 12/1983 Japan .

OTHER PUBLICATIONS

William N. Carr and Jack P. Maize, "MOS/LSI Design and Application", McGraw–Hill Book Company, 1972, pp. 208–228.

Primary Examiner—Viet Q. Nguyen
Attorney, Agent, or Firm—Sughrue, Mion, Zinn, Macpeak & Seas

[57] ABSTRACT

A device is provided for static random access memories (SRAM's), including an apparatus capable of executing more than one kind of logical operation for each memory cell, with a relatively small number of elements, and the same configuration for different types of operations. These operations include (1) the normal read-out/write-in operations; (2) inverting the contents of one sequence of memory cells and storing either the result or the result shifted one bit to the right in a second sequence of memory cells; (3) storing the result of an OR operation between two sequences of memory cells in a third sequence of memory cells; and (4) initializing each memory cell. The left or right node potential of each memory cell may also be individually accessed. Each operation between memory cells is simultaneous with the direct writing of the result into other memory cells, so no temporary holding cells are required and the operation is accomplished at high speed.

8 Claims, 14 Drawing Sheets

| INPUT | 73 | REGULAR MODE (AM="100") | | INVERTING OPERATION MODE (AM="001") | OR MODE (AM="010") | INVERTED SHIFT MODE (AM="011") |
|---|---|---|---|---|---|---|
| | 71 | L | H | * | * | * |
| OUTPUT | 722 | H | L | L | L | L |
| | 723 | L | H | L | L | L |
| | 724 | L | L | H | L | L |
| | 725 | L | L | L | L | H |

FIG. 12

| | | Regular Mode (441="H") | | Inverting Operation Mode (442="H") | | | OR Mode (443="H") | | | | Inverted Shift Mode (444="H") | | |
|---|---|---|---|---|---|---|---|---|---|---|---|---|---|
| INPUT | 13 | H | L | H | H | L | H | L | L | L | H | L | L |
| | 23 | * | * | * | * | * | * | H | * | L | * | * | L |
| | 33 | * | * | * | H | L | * | L | H | L | * | H | L |
| OUTPUT | RIGHT WORD LINE WRI | H | L | H | L | L | L | L | H | L | H | L | L |
| | LEFT WORD LINE WLI | H | L | L | H | L | L | H | H | L | L | H | L |
| | WORD POWER SUPPLY LINE WVI | Vcc | Vcc | Vcc | Vcc→0.5Vcc→Vcc | Vcc | Vcc | Vcc→1.5Vcc→Vcc | Vcc→0.5Vcc→Vcc | Vcc | Vcc | Vcc→0.5Vcc→Vcc | Vcc |
| | WORD GROUND LINE WGI | GND | GND | GND | GND→0.5Vcc→GND | GND | GND | GND→0.5Vcc→GND | GND→0.5Vcc→GND | GND | GND | GND→0.5Vcc→Vcc | GND |

FIG. 14

FIG. 18
| INPUT | 486 | L | L | H |
| --- | --- | --- | --- | --- |
| | 487 | L | H | * |
| OUTPUT | WVI | Vcc | 1.5Vcc | 0.5Vcc |
| | WGI | GND | 0.5Vcc | 0.5Vcc |
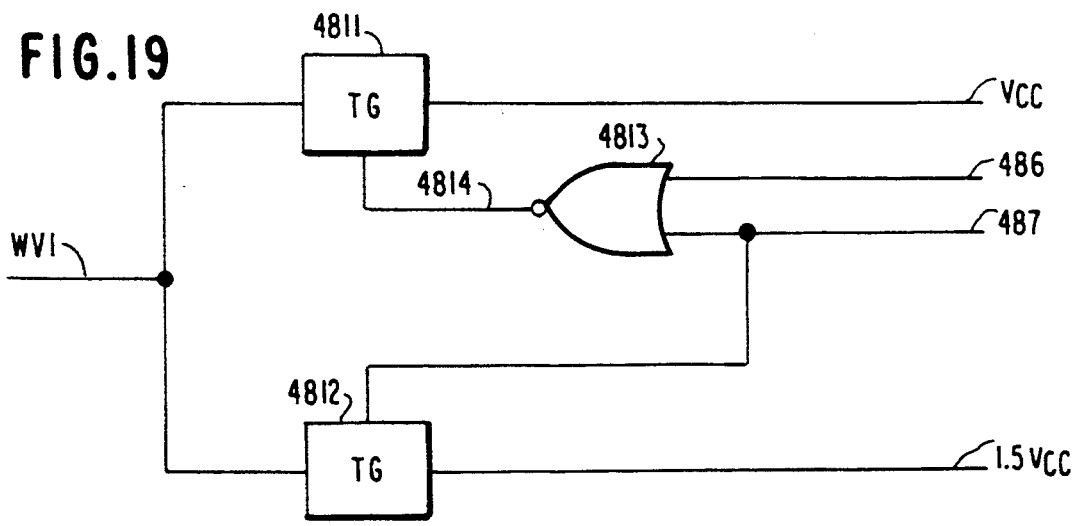
FIG. 19
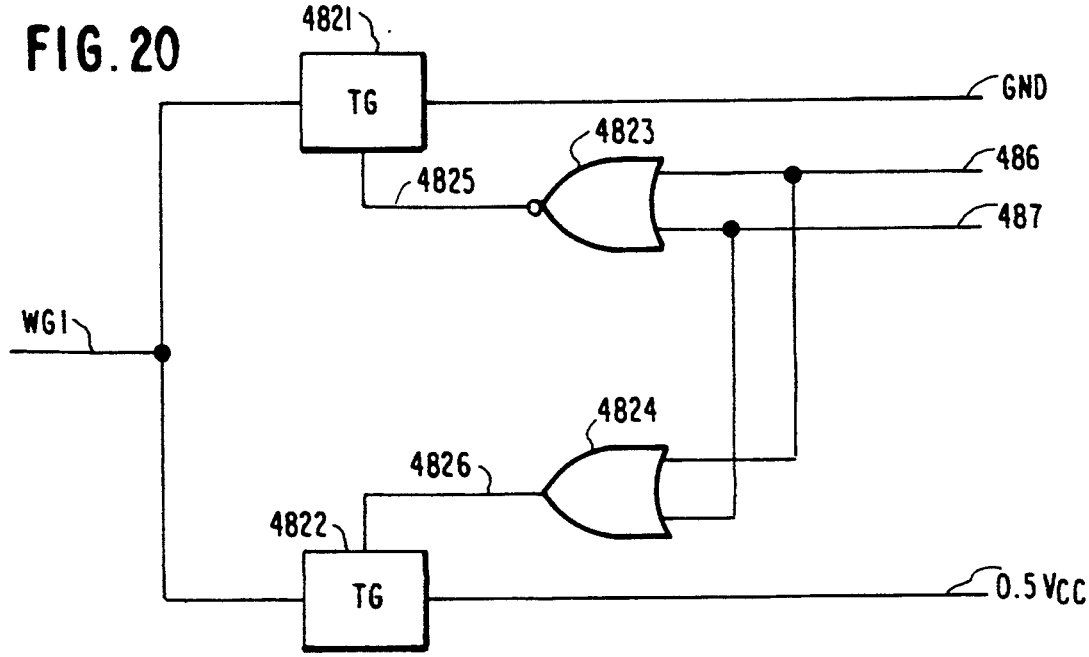
FIG. 20

MEMORY CELLS AND A MEMORY APPARATUS USING THEM

BACKGROUND OF THE INVENTION

The present invention relates to the improvement of memory cells for static random access memories (RAM's) and a memory apparatus using memory cells thereby improved, and more particularly to a memory apparatus having a function for logic operation.

While static RAM's have been improved in various ways, there has been no major change in the basic structure of memory cells. For an example of basic structure of memory cells for static RAM's, reference may be made to William N. Carr and Jack P. Maize, MOS/LSI Design and Application, P.211, FIG. 7.12. Referring to this FIG. 7.12, the memory cell illustrated there consists of transistors T1 and T2 for storage use, gating transistors T3 and T4 for T1 and T2, and load devices TL1 and TL2. The gates of the gating transistors T3 and T4 are connected to a word select line.

In such a memory cell, the gating transistors T3 and T4 are simultaneously controlled via the word select line. In reading data out of this memory cell, for instance, the potential of the word select line is set at a high level. This causes the potentials at Q and $\overline{Q}$ to be transmitted to bit lines (1) bit and (0) bit. Or when writing data into this memory cell, the bit lines (1) bit and (0) bit are set at prescribed potentials and the word select line at a high level. This causes the potentials of the bit lines (1) bit and (0) bit to be held by the transistors T1 and T2.

However, in this memory cell of a conventional static RAM, the gating transistors T3 and T4 are simultaneously controlled via the single word select line, but the bit lines (1) bit and (0) bit cannot be controlled independent of each other. Moreover, in this memory cell of the prior art static RAM, a constant source voltage Vcc and a constant ground voltage are supplied, and neither voltage can be varied. There further is the problem that the aforementioned structural limitation restricts the operations that can be executed by this conventional memory cell to nothing more than reading out and writing in.

On the other hand, research is undertaken on a functional memory whose memory element is given an operational function as an approach to overcome the Von-Neuman bottle-neck in conventional computers and achieve hyperparallel operation. The functional memory architecture is designed to introduce a function for logic operation into the memory and to fuse the memory function and the computing function. Such a functional memory is part of the prior art, and a functional memory to execute exclusive OR operation within the memory is known as a content addressable memory (CAM). For an example of memory cell for such a CAM, reference may be made to William N. Carr and Jack P. Maize, MOS/LSI Design and Application, p.224, FIG. 7.20.

The memory cell illustrated in FIG. 7.20 consists of transistors T1, T2, T3, T4, TL1 and TL2, which constitute the aforementioned basic memory cell, plus T5, T6, T7 and T8, which constitute an exclusive OR element. In this memory cell, when prescribed potentials are provided to bit lines B(0) and B(1), the exclusive OR of the truth value corresponding to these potentials and the truth value stored in the transistors T1 and T2 is computed and sent out to a signal line SUM.

In this CAM, however, the data whose NOR's with the stored values in the memory cell are to be computed are supplied from outside via the bit lines B(0) and B(1), and the result of the NOR operation is supplied to the outside via the signal line SUM. Therefore, there is the problem that, in order to subject the stored values in a first memory cell and those in a second memory cell to an arithmetic operation and store the result in a third memory cell, the result of the operation between the stored values in the first memory cell and those in the second memory cell should be once stored outside, and can be written into the third memory cell only after that.

There further is the need to provide each cell with an exclusive OR element in this CAM. Accordingly, a CAM having a memory cell array of 1,000 rows by 1,000 columns would require 1,000,000 exclusive OR elements built into it. This means the problem that the required number of elements becomes very large, inviting a drop in the degree of integration.

Moreover, this CAM can accomplish no other operation than the types of operation of the logic operation elements provided in advance in each cell, so that, in order to execute many different kinds of operation, each cell should be provided with as many different kinds of operation elements, and this again leads to the problem of an increased number of required elements and a drop in the degree of integration.

SUMMARY OF THE INVENTION

An object of the present invention is to provide, in view of the aforementioned problems, memory cells for static random access memories (SRAM's), which would make possible diverse operations.

Another object of the invention is to provide a memory apparatus capable of executing more than one kind of logical operation for each memory cell with a relatively small number of elements.

According to the present invention, in order to achieve the object mentioned first, there is provided a memory cell for SRAM's provided with a transistor, to whose gate is connected a left word line, for connecting a left bit line to the memory cell; another transistor, to which is connected a right word line controlled independent of said left word line, for connecting a right bit line to said memory cell; a power supply terminal for receiving a source voltage from another circuit; and a ground terminal for receiving a ground voltage from another circuit.

The aforementioned memory cell for SRAM's can perform the following operations besides the usual read-out/write-in operations. First, in this memory cell, the potential at the left node of the memory cell can be individually accessed by setting only the left word line at a high level. Second, in this memory cell, the potential at the right node of the memory cell can be individually accessed by setting only the right word line at a high level. Third, by equalizing the potential at the power supply terminal and that at the ground terminal, the stored content in the memory cell can be deleted to initialize the memory cell.

A memory apparatus according to the invention has (1) an array of said memory cells of which each sequence in the lateral direction is connected to the same left word line, right word line, power supply line and ground line, and each sequence in the vertical direction is connected to the same left bit line and right bit line; (2) a bit line control circuit for controlling the bit lines connected to said memory cells; and (3) word line control circuits, one of which is provided for each sequence of memory cells in the lateral direction to control the potentials of the left word line, right word line, power supply line and ground line of that sequence.

When an inverted operation is received as the mode control signal, the result of the inversion of the contents stored in the memory cells of a first sequence can be stored into the memory cells of a second sequence by (1) having the bit line control circuit connect the right bit line and the left bit line of at least one vertical sequence in the memory cell array; (2) having a first word line control circuit, selected by a first word address decoder, set the potential of the left word line at a high level; (3) having a second word line control circuit, selected by a second word address decoder, set the potential of the right word line at a high level; and (4) having the second word line control circuit temporarily equalize the potential of the power supply line and that of the ground line.

Then, the OR of the contents stored in the first sequence of memory cells and the contents stored in the second sequence of memory cells can be stored into a third sequence by (1) having the bit line control circuit open the right bit line and the left bit line of the memory cell array; (2) having the first word line control circuit, selected by the first word address decoder, set the potential of the right word line at a high level; (3) having the second word line control circuit, selected by the second word address decoder, set the potential of the left word line at a high level; (4) having the second word line control circuit temporarily raise the potential of the power supply line and that of the ground line; and (5) having a third word line control circuit, selected by a third word address decoder, set the right word line and the left word line at a high level and temporarily equalize the potential of the power supply line and that of the ground line.

Further, when an inverted shift operation is received as the mode control signal, the result of the inversion of the contents stored in the first sequence of memory cells and the shifting of the inverted content by one bit to the right can be stored into the memory cells of the second sequence by (1) having said bit line control circuit connect the right bit line of at least one vertical sequence and the left bit line of the sequence immediately to the right of that sequence in the memory cell array; (2) having the first word line control circuit, selected by the first word address decoder, set the potential of the left word line at a high level; (3) having the second word line control circuit, selected by the second word address decoder, set the potential of the right word line at a high level; and (4) having the second word line control circuit temporarily equalize the potential of the power supply line and that of the ground line.

Since the result of operation between memory cells can be directly written into another memory cell, the memory apparatus according to the present invention requires no holding means for temporarily holding the contents of those memory cells outside. Furthermore, as operation between memory cells and the writing-in of its result simultaneously take place, the operation and the writing-in ensuing from it can be executed at high speed.

Furthermore, in the memory apparatus according to the invention, which requires only one word line control circuit for each sequence of memory cells, the number of required elements is smaller than in a CAM in which each memory cell is provided with a logical operation element. Therefore, when it is composed into an LSI chip, the degree of integration is increased to enable more memory cells to be built into the same square measure.

Moreover, the memory apparatus according to the invention is capable of three different operations including inversion, OR operation and inverted shift operation with the same configuration. Accordingly there is no need to provide each memory cell with an operational element for each type of operation.

BRIEF DESCRIPTION OF THE DRAWINGS

FIG. 12 is a diagram illustrating the operation of word line control circuit 40 in the first embodiment of the invention;

FIG. 14 is a time chart illustrating the operation of the timing control circuit 45 in the first embodiment of the invention;

FIG. 18 is a block diagram illustrating the operation of the power supply control circuit 48 in the first embodiment of the invention;

FIG. 19 is a circuit diagram illustrating the configuration of the power supply switching circuit 481 in the first embodiment of the invention; and FIG. 20 is a circuit diagram illustrating the configuration of the ground switching circuit 482 in the first embodiment of the invention.

In the drawings, the same reference numerals denote respectively the same constituent elements.

DETAILED DESCRIPTION OF THE PREFERRED EMBODIMENT

Figure 1:
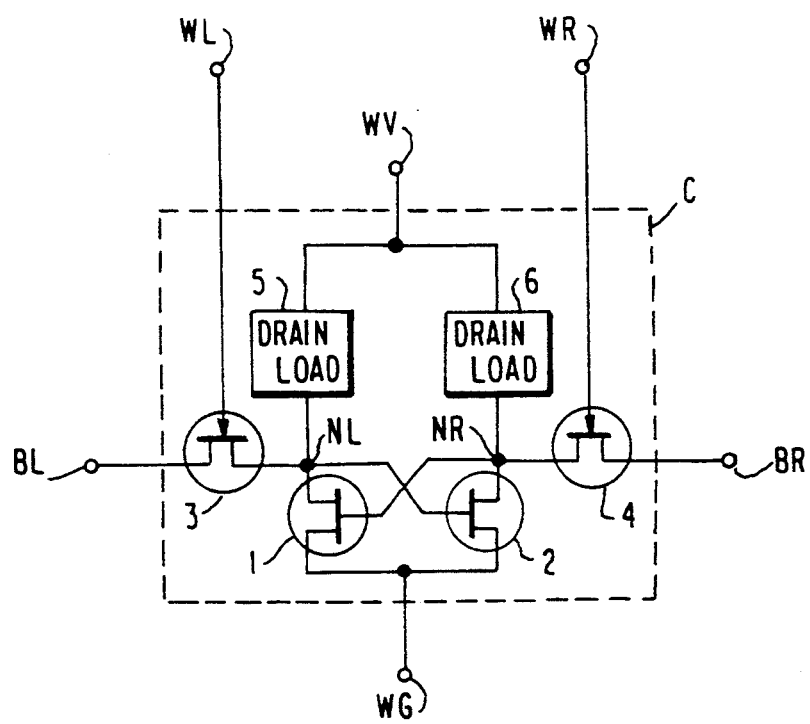
FIG. 1 is a circuit diagram illustrating an example of memory cell for SRAM's according to the present invention.

Referring to FIG. 1, a memory cell C, which is for use in a first preferred embodiment of the present invention, comprises nMOSFET's 1 and 2 for data storage, drain loads 5 and 6 of the FET's 1 and 2, respectively, and gateing nMOS-FET's 3 and 4 subject to on/off control by left and right word lines WL and WR.

The drains of the FET's 1 and 2 for data storage are connected to a power supply line WV via the drain loads 5 and 6. Meanwhile, the sources of the FET's 1 and 2 are connected to a ground line WG. The feeding of a source voltage Vcc to the power supply line WV and a ground voltage GND to the ground line WG puts the memory cell C into a state in which a datum can be stored into it. Herein, this state of the memory cell C in which it can store data is described by saying "the memory cell C is activated".

In the activated memory cell C, the stored datum is expressed as the potentials of a left node NL and a right node NR. Here, "1" is supposed to be stored in the memory cell C when the potential of the left node NL is at its high level "H"=Vcc and that of the right node NR is at its low level "L"=GND. Conversely, when the potential of the left node NL is at "L" and that of the right node NR is at "H", "0" is supposed to be stored in the memory cell C.

When a datum is to be written into the memory cell C, the potentials of a left bit line BL and of a right bit line BR are set at levels representing the datum to be written. After prescribed potentials are fed to the left bit line BL and the right bit line BR, the potentials of both the left word line WL and the right word line WR are set at "H". At this time, if the potential of the left bit line BL is higher than that of the right bit line BR, "1" will be written into the memory cell C. Conversely, if the potential of the right bit line BR is higher than that of the left bit line BL, "0" will be written into the memory cell C. This operation is no different from the usual write-in operation of any SRAM.

When a datum written into the memory cell C is to be read out, the potentials of both the left word line WL and the right word line WR are so controlled as to become "H". When the potentials of both the left word line WL and the right word line WR are set at "H", the potentials of the left node NL and of the right node NR are transmitted to the left bit line BL and the right bit line BR, respectively. By having the potentials transmitted to the left bit line BL and to the right bit line BR referred to, the datum stored in the memory cell C can be identified. This operation is no different from the usual read-out operation of any general purpose SRAM.

In this memory cell C, it is also possible to access refer the potential of either the left node NL or the right node NR. In this case, the potential of the left word line WL and that of the right word line WR are controlled independently of one another. If the control is so effected as to set the potential of the right word line WR at "L" and that of the left word line WL at "H", the potential of the left node NL can be transmitted to the left bit line BL without affecting the potential of the right bit line BR. Or if the control is so effected as to set the potential of the left word line WL at "L" and that of the right word line WR at "H", the potential of the right node NR can be transmitted to the right bit line BR without affecting the potential of the left bit line BL.

Furthermore, this memory cell C permits the following operation by appropriate control of the potentials of the ground line WG and the power supply line WV. First, by feeding equal potentials to the power supply line WV and the ground line WG, the datum held in the memory cell C is deleted to initialize the memory cell C. Herein, the feeding of equal voltages to the power supply line WV and the ground line WG is described by the phrase "the memory cell C is inactivated". Second, by displacing the source voltage fed to the power supply line WV and the ground voltage fed to the ground line WG by certain quantities, the potential at the left node NL and that at the right node NR can be varied while keeping the stored datum intact. In so doing, the quantities of displacement of the potentials at the left node NL and at the right node NR will be equal to the quantities of displacement of a source voltage and of the ground voltage, respectively. For instance, in the memory cell C storing "1", if the power supply line WV is set at 1.5 Vcc and the ground line WG at 0.5 Vcc, the potential at the left node NL will rise to 1.5 Vcc, and that at the right node NR, to 0.5 Vcc.

DESCRIPTION OF THE MEMORY APPARATUS

Although there is no limitation on the numbers of columns and rows in the memory cell array of a memory apparatus according to the present invention, making it possible to realize a memory cell array of 256 rows by 256 columns for instance, the following description, to facilitate understanding, will refer to a memory cell array of three rows by two columns.

Figure 2:
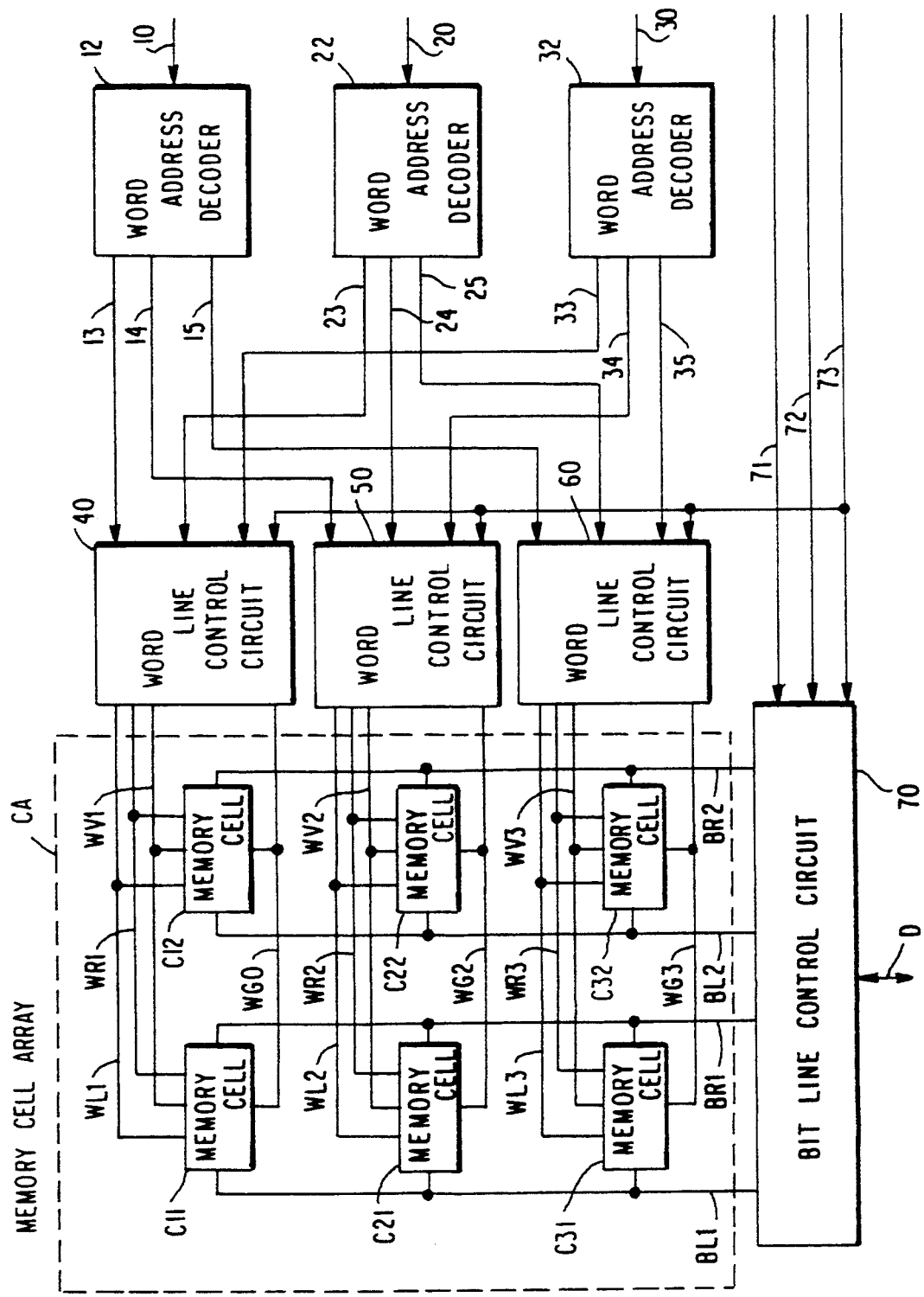
FIG. 2 is a block diagram illustrating an example of memory apparatus according to the invention.

Referring to FIG. 2, the memory apparatus according to the invention comprises six memory cells C11, C21, C31, C12, C22 and C32 for data storage; word line control circuits 40, 50 and 60 for controlling the right word line WR, the left line WL, the word power supply line WV and the ground line WG of each memory cell on a row-by-row basis; word address decoders 12, 22 and 32 for controlling the word line control circuits; and a bit line control circuit 70 for controlling on a column-by-column basis a right bit line BR and a left bit line BL connected to each memory cell.

The memory cells C11 through C32 in this memory apparatus are of the same type memory cell C described with reference to the first preferred embodiment of the invention. Memory cells C11 through C32, arranged in a matrix of three rows by two columns, constitute a memory cell array CA.

The potentials of the left word lines WL, the right word lines WR, the power supply lines WV and the ground lines WG of the memory cells C11 through C32 are controlled on a column-by-column basis. For instance, on the first row of the memory cell array CA, the left word line WL11 of memory cell C11 and the left word line WL12 of memory cell C12 are connected to one left word line WL1. Similarly, the right word lines WR, the power supply lines WV and the ground lines WG of the memory cells C11 and C12 are connected to a right word line WR1, a power supply line WV1 and a ground line WG1.

To control the memory cell array CA, word addresses WA10, WA20 and WA30, a bit address BA, a control signal CS and an operation mode signal AM are supplied from outside (not shown).

The word addresses WA10, WA20 and WA30, which are two-bit signals sent via signal lines 10, 20 and 30, respectively, designate the row position in the memory cell array CA. In this embodiment, they designate the first line when the word address is "00", the second line when it is "01" or the third line when it is "10".

The bit address BA, which is a one-bit signal sent via a signal line 71, designates the column position in the memory cell array CA. In this embodiment, it designates the first column when the bit address BA is "0" or the second column when it is "1".

The operation mode signal AM, which is a three-bit signal sent via a signal line 73, designates the type of logical operation to be executed by the memory cell array CA. In this embodiment, it designates the regular mode when the operation mode signal AM is "000", the inversion mode when it is "001", the OR mode when it is "010", the inverted shift mode when it is "011", or the ready mode when it is "100".

The control signal CS, which is a one-bit signal sent via a signal line 72, designates either the read-out operation or the write-in-operation. In this embodiment, it designates the read-out operation when the control signal CS is "0" or the write-in operation when it is "1".

The potentials of the bit lines BL1 through BR2 of the memory cell array CA and the mutual connection between the bit lines are controlled by the bit line control circuit 70. The bit line control circuit 70, which is controlled with the bit address BA, the control signal CS and the operation mode signal AM, has the following two functions. First, it functions as a column address decoder to execute the read-out operation and the write-in operation on a column designated by the bit address BA. Second, it has a function to connect prescribed bit lines in accordance with the bit address BA and the operation mode signal AM.

Figure 9:
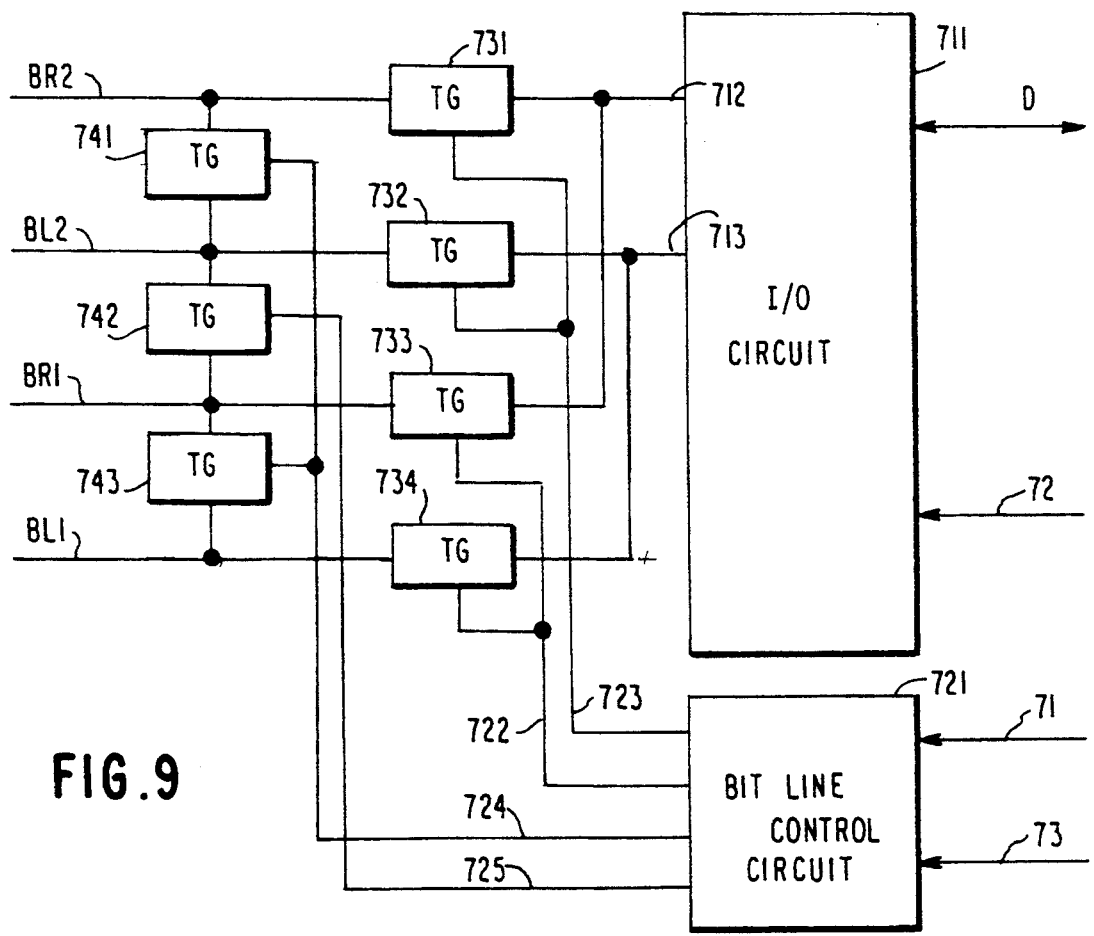
FIG. 9 is a block diagram illustrating the configuration of the bit control circuit 70 in the first embodiment of the invention.

Referring now to FIG. 9, the bit line control circuit 70 comprises transfer gates 731, 732, 733, 734, 741, 742 and 743, an input/output (I/O) circuit 711 and a bit line selector circuit 721.

Figure 10:
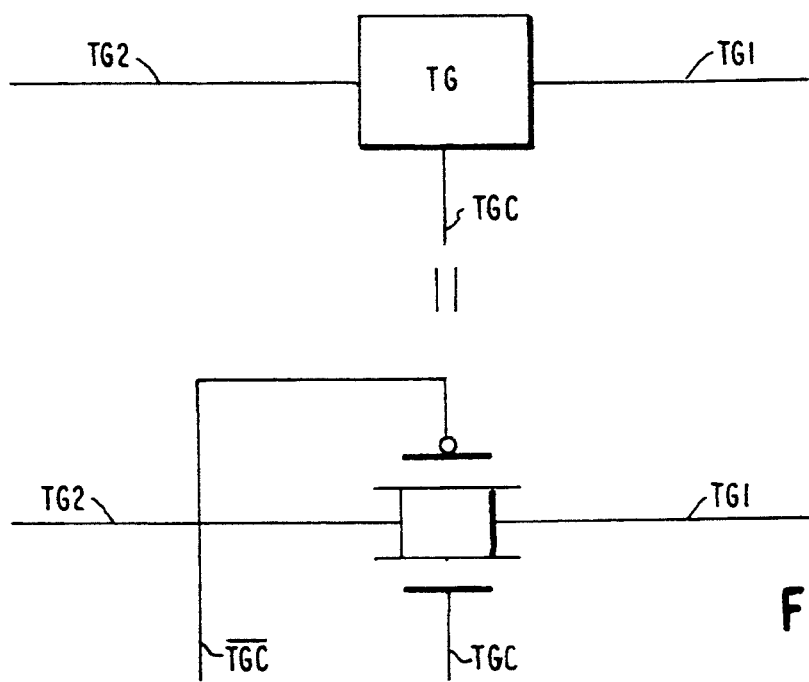
FIG. 10 is a block diagram illustrating the configuration of the transfer gate in the first embodiment of the invention.

Referring to FIG. 10, a transfer gate TG, consisting of two FET's, electrically connects terminals TG1 and TG2 when the potential at a terminal TGC is "H", and insulates terminals TG1 and TG2 when the potential at terminal TGC is "L".

Referring again to FIG. 9, the I/O circuit 711 executes the read-out/write-in operation on the signal lines 712 and 713 in accordance with the instruction of the control signal CS. The I/O circuit 711 is similar to a ordinary column address decoder for SRAM's except that it has no bit line selecting function, and can be readily realized by slightly modifying a conventional column address decoder.

The bit line selector circuit 721 controls the transfer gates 731 through 743 by feeding prescribed potentials to connection instructing signal lines 722 through 725 on the basis of the bit address BA and the operation mode signal AM received via the signal lines 71 and 73, respectively. The relationship between the input and the output of the bit line selector circuit 721 is shown in the truth value table of FIG. 11, wherein "*" indicates that the value may be either "H" or "L". A logic circuit having such an input-output relationship can be readily composed by properly combining logic elements.

Referring again to FIG. 9, the transfer gates 731 through 734 connect the signal lines 712 and 713 to the bit lines BL1 through BR2 in accordance with the connection instructing signals 722 and 723. The transfer gates 741 through 743 connect the bit lines to each other in accordance with the connection instructing signals 724 and 725.

Referring back to FIG. 2, the control of each row in the memory cell array CA is accomplished by sending the word addresses WA10, WA20 and WA30 to the word address decoders 12, 22 and 32, respectively. The word address decoders 12, 22 and 32, which are ordinary decoders, decode the word addresses WA10, WA20 and WA30, and send selection signals to one of the word line control circuits 40, 50 and 60. For instance, when the word address WA10 designating the first column of the memory cell array CA is sent to the word address decoder 12, the word address decoder 12 sends a selection signal SS13 to the word line control circuit 40 via a signal line 13. The sending of the selection signal SS13 is accomplished by setting the potential of the signal line 13 at "H".

The word line control circuits 40, 50 and 60 have exactly the same configuration, and one of them is provided for each row of the memory cell array CA. The word line control circuits 40, 50 and 60 control the left word lines WL, the right word lines WR, the power supply lines WV and the ground lines WG of the corresponding columns on the basis of selection signals SS sent from the word address decoders 12, 22 and 32 and the operation mode signal AM. For instance, the word line control circuit 40 controls the left word line WL1, the right word line WR1, the power supply line WV1 and the ground line WG1 on the basis of the operation mode signal AM and the selection signals SS13, SS23 and SS33.

FIG. 12 illustrates the relationship between the input and the output of the word line control circuit 40. In the Figure, "*" indicates that the value may be either "H" or "L". The entries of three consecutive values each in the columns of WV1 and WG1 in FIG. 12 indicate that the potentials of WV1 and WG1 vary during operation. For instance, the column of WV1 when the operation mode signal AM indicates the inversion mode and 13="L", 23="*" and 33="H" shows that WV1 once drops from Vcc to 0.5 Vcc and later returns to Vcc.

Figures 11, 13:
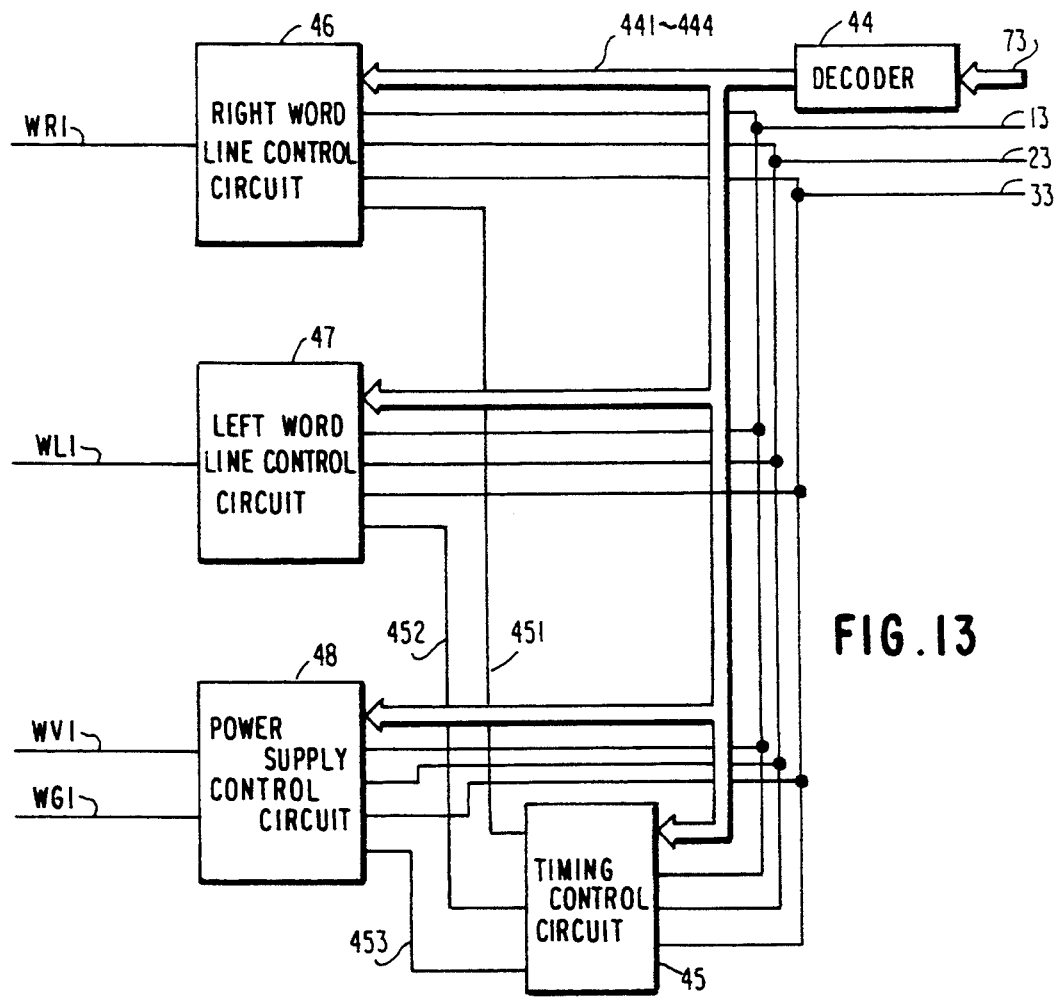
FIG. 11 is a table of the truth value of the bit control circuit 70 in the first embodiment of the invention.
FIG. 13 is a block diagram illustrating the configuration of the word line control circuit 40 in the first embodiment of the invention.

Referring now to FIG. 13, the word line control circuit 40 comprises a decoder 44 for decoding the operation mode signal AM; a right word line control circuit 46 for controlling the potential of the right word line WR1; a left word line control circuit 47 for controlling the potential of the left word line WL1; a power supply control circuit 48 for controlling the potentials of the power supply line WV1 and of the ground line WG1; and a timing control circuit 45 for synchronizing the right word line control circuit 46, the left word line control circuit 47 and the power supply control circuit 48 by varying the potentials of timing control signal lines 451, 452 and 453 at prescribed time intervals.

The decoder 44, which is an ordinary decoder, decodes the operation mode signal AM and sets at "H" the potential of a signal line 441 when in the regular mode, that of a signal line 442 when in the inversion mode "001", that of a signal line 443 when in the OR mode "010" or that of a signal line 444 when in the inverted shift mode "011". When the operating mode signal AM is "100" indicating the ready mode, the potentials of the signal lines 441 through 444 are all set at "L".

Figure 14:
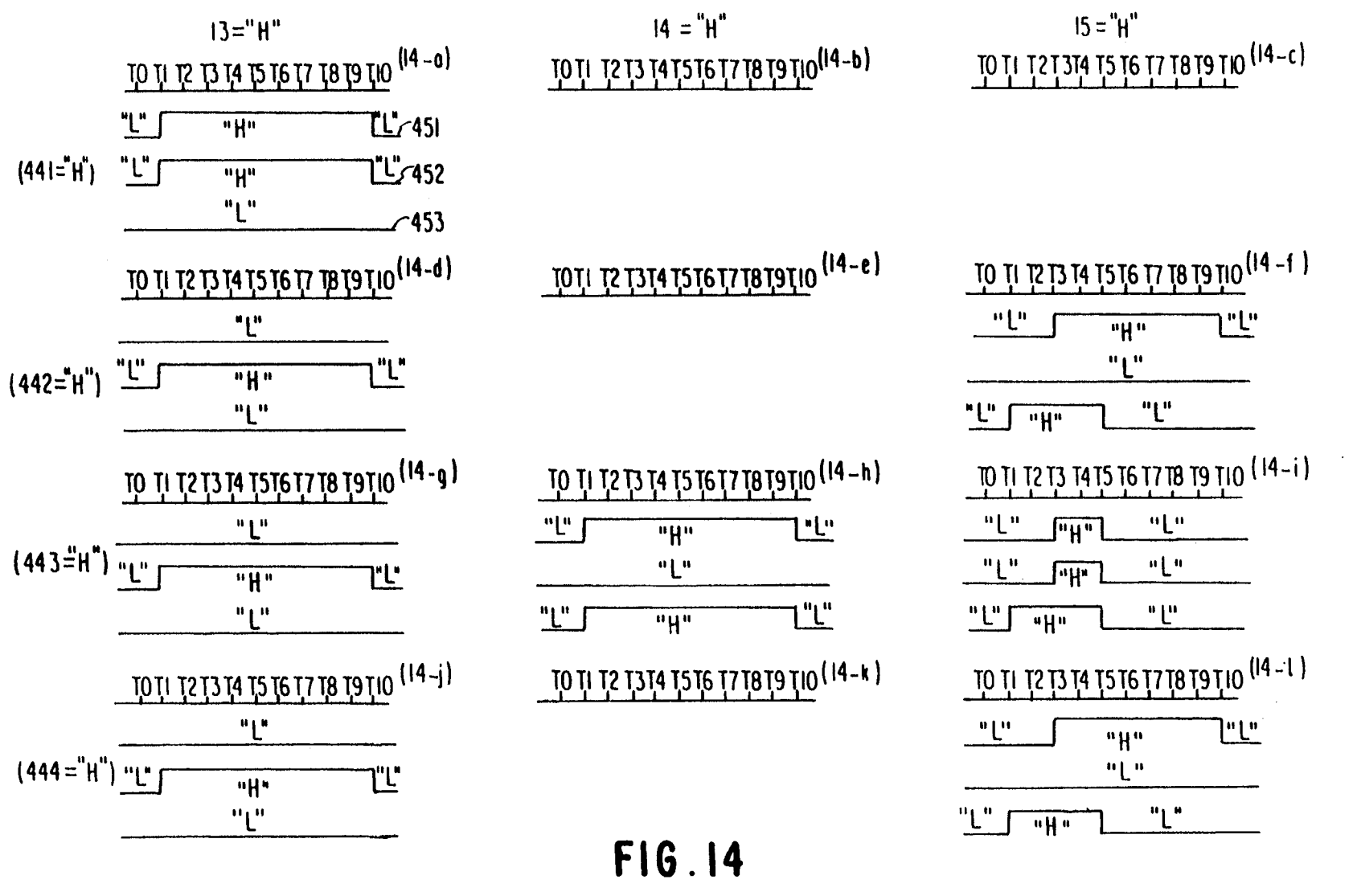

The timing control circuit 45 controls the potentials of the timing control signal lines 451, 452 and 453 at the timing shown in FIG. 14 according to the potentials of the signal lines 441 through 444 and of the signal lines 13, 23 and 33.

Figure 15:
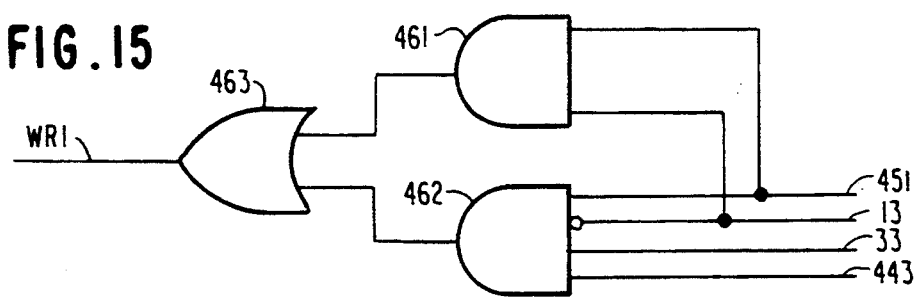
FIG. 15 is a block diagram illustrating the configuration of the right word line control circuit 46 in the first embodiment of the invention.

The right word line control circuit 46 controls the potential of the right word line WR1 as shown in FIG. 12 according to the potentials of the signal lines 441 through 444, of the signal lines 13, 23 and 33 and of the timing control signal line 451. Referring to FIG. 15, such a right word line control circuit 46 consists of two AND circuits 461 and 462 and one OR circuit 463.

Figure 16:
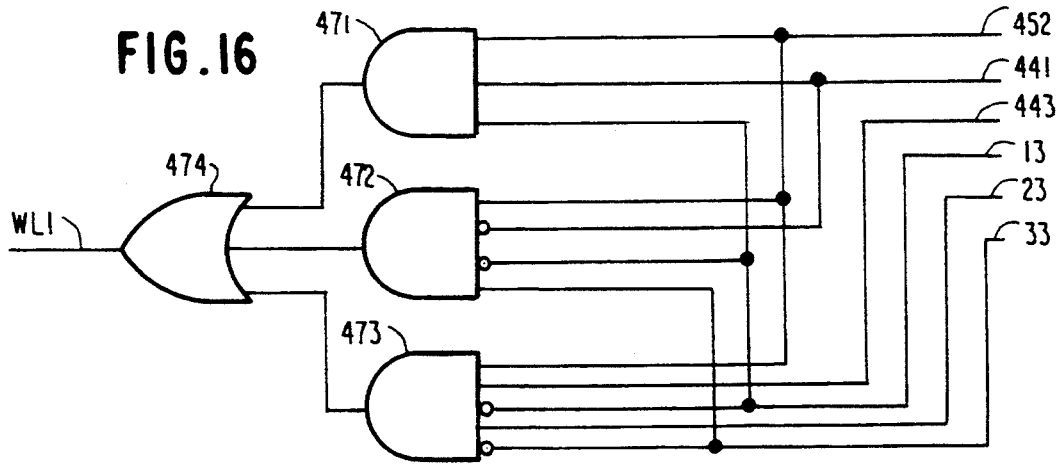
FIG. 16 is a block diagram illustrating the configuration of the left word line control circuit 47 in the first embodiment of the invention.

The left word line control circuit 47 controls the potential of the left word line WL1 as shown in FIG. 12 according to the potentials of the signal lines 441 through 444, of the signal lines 13, 23 and 33 and of the timing control signal line 452. Referring to FIG. 16, such a left word line control circuit 47 consists of three AND circuits 471, 472 and 473 and one OR circuit 464.

Figure 17:
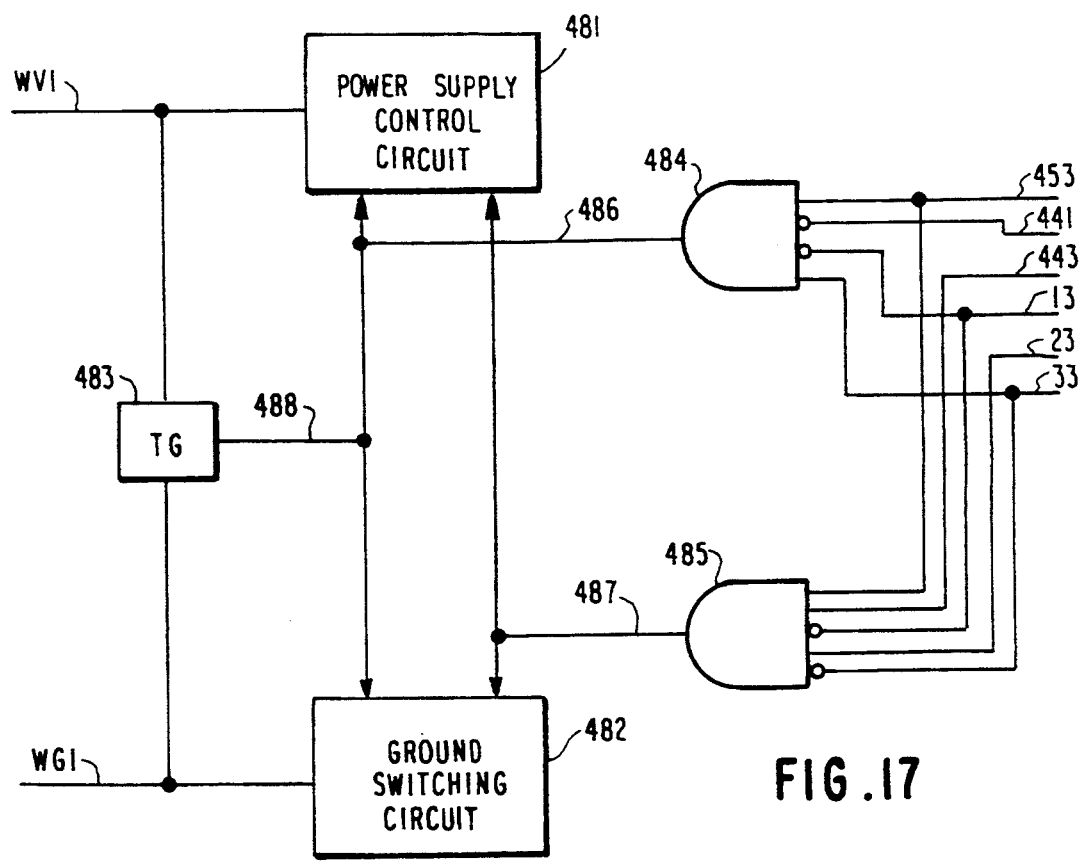
FIG. 17 is a block diagram illustrating the configuration of the power supply control circuit 48 in the first embodiment of the invention.

Referring again to FIG. 13, the power supply control circuit 48 controls the potentials of the power supply line WV1 and of the ground line WG1 as shown in FIG. 12 according to the potentials of the signal lines 441 through 444, of the signal lines 13, 23 and 33 and of the timing control signal line 453. Referring to FIG. 17, such a power supply control circuit 48 consists of a power supply switching circuit 481, a ground switching circuit 482, a transfer gate 483, and AND circuits 484 and 485. The AND circuit 484 sets the potential of the inactivating signal line 486 at "H". The AND circuit 485 sets the potential of a bias signal 487 at "H". The power supply switching circuit 481 feeds a prescribed voltage to the power supply line WV1 according to the potentials of the inactivating signal line 486 and the bias signal line 487. The relationship between the potentials of the inactivating signal line 486 and of the bias signal line 487 and the voltage fed to the power supply line WV1 is illustrated in FIG. 18.

Referring to FIG. 17, the ground switching circuit 482 feeds a prescribed voltage to the ground line WG1 according to the potentials of the inactivating signal line 486 and the bias signal line 487. The relationship between the potentials of the inactivating signal line 486 and of the bias signal line 487 and the voltage fed to the ground line WG1 is illustrated in FIG. 18.

Referring to FIG. 19, the power supply switching circuit 481 consists of transfer gates 4811 and 4812, and a NOR circuit 4813. To the transfer gate 4811 is fed a voltage Vcc, and to the transfer gate 4812, 1.5 Vcc, a voltage 1.5 times as high as Vcc. The power supply switching circuit 481 feeds either Vcc or 1.5 Vcc to the power supply line WV1 as shown in FIG. 18 according to the potentials of the inactivating signal line 486 and of the bias signal line 487.

Referring to FIG. 20, the ground switching circuit 482 consists of transfer gates 4821 and 4822, a NOR circuit 4823 and an OR circuit 4824. To the transfer gate 4821 is fed a voltage GND, and to the transfer gate 4822, 0.5 Vcc, a voltage 0.5 times as high as Vcc. The ground switching circuit 482 feeds either Vcc or 0.5 Vcc to the ground line WG1 as shown in FIG. 18 according to the voltages of the inactivating signal line 486 and of the bias signal line 487.

Next will be described the read-out operation of the memory apparatus according to the present invention when in the regular mode with reference to FIGS. 2 and 3 together. The following description concerns the operation to read out the content of the memory cell C11 when "1" is stored therein.

Figure 3:
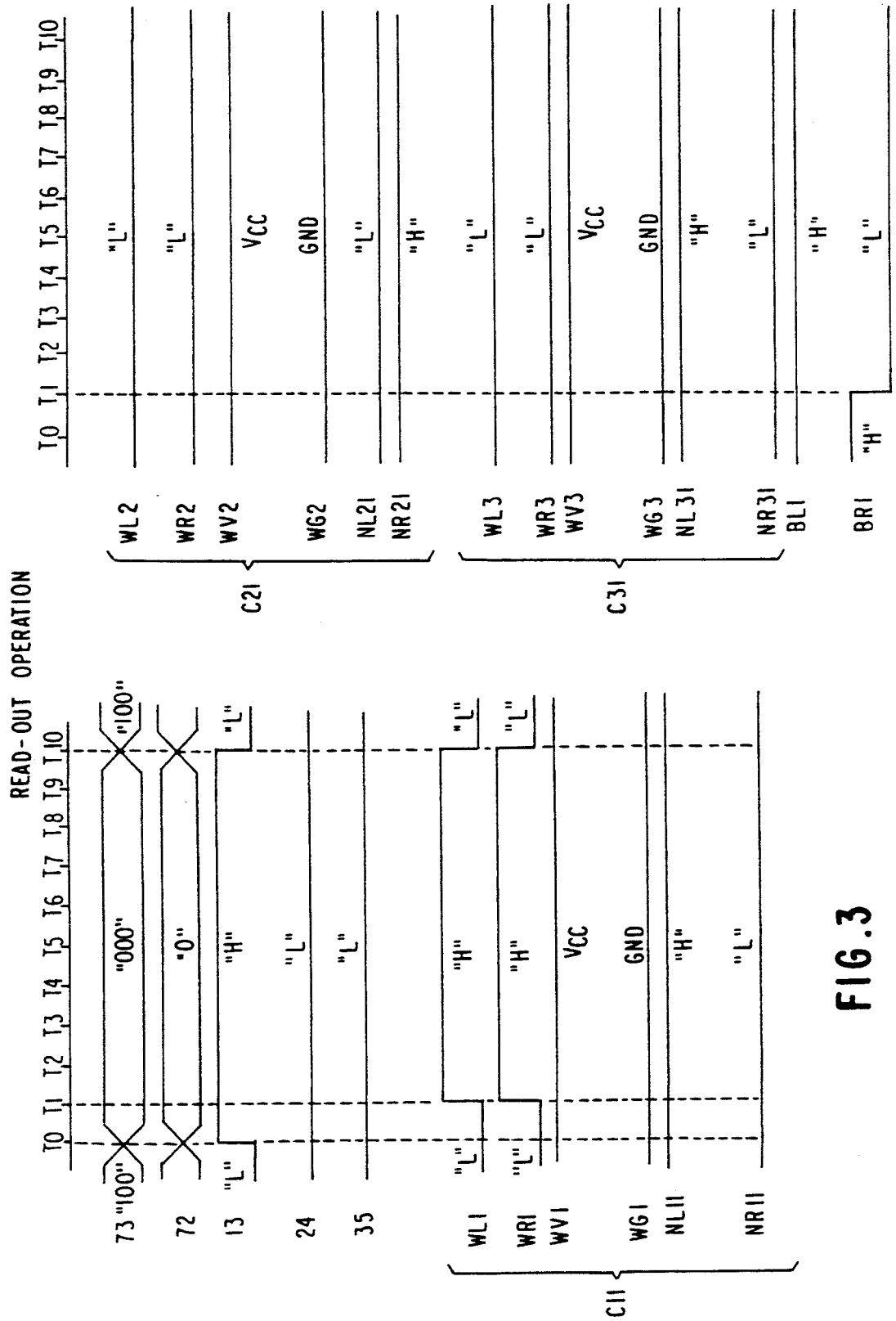
FIG. 3 is a time chart illustrating the read-out operation of a first preferred embodiment of the invention in the regular mode.

Referring to FIGS. 2 and 3, before the start of the operation, an operation mode signal AM="100" representing the ready mode is sent to the signal line 73. At time T0, the operation mode signal AM varies from the ready mode "100" to the regular mode "000", and the operation starts.

Also at time T0, a control signal CS="0" designating the read-out operation is sent to the signal line 72, a bit address BA="0" indicating the first column, to the signal line 71, and a word address WA10="00" designating the first column, to the signal line 10.

Referring to FIG. 9, the bit line selector circuit 721 in the bit line control circuit 70 connects the transfer gates 731 through 743 in accordance with the bit address BA="0" received via the signal line 71. Referring to FIG. 11, since only the potential of the signal line 722 is set at "H" in this case, the left bit line BL1 is connected to the signal line 713, and the right bit line BR1 to the signal line 712.

Referring back to FIG. 2, the word address decoder 12, which received at time T0 the word address WA10="00" via the signal line 10, decodes "00". Referring to FIG. 3, as a result, the word address decoder 12 sends a selection signal SS13 by setting the potential of the signal line 13 at "H".

Referring now to FIG. 13, as a result of the change of the operation mode signal AM from the ready mode "100" to the regular mode "000" at time T0, the decoder 44 in the word line control circuit 40 sets the potential of the signal line 441 at "H". The timing control circuit 45 starts its timer operation when the potential of the signal 441 has varied to "H", and controls the potentials of the timing control signal lines 451, 452 and 453 at a predetermined timing. Referring to FIG. 14, since the potential of the signal line 13 is "H" in this case, the potentials of the signal lines 451, 452 and 453 are controlled at the timing of 14-a.

Referring again to FIG. 13, at time T1, the timing control circuit 45 sets the potentials of the timing control signal lines 451 and 452 at "H". Referring to FIG. 3, as a result of the change of the potential of the timing control signal line 451 to "H", the right word line control circuit 46 sets the potential of the right word line WR1 at "H". This causes the potential "L" of the right node NR11 of the memory cell C11 to be transmitted to the right bit line BR1. Also, as a result of the change of the potential of the timing control signal line 452 to "H", the left word line control circuit 47 sets the potential of the left word line WL1 at "H". This causes the potential "H" of the left node NL11 of the memory cell C11 to be transmitted to the left bit line BL1.

Then the I/O circuit 711, for which the read-out operation is designated by the control signal CS, determines the stored content in the memory cell C11 to be "1" by comparing the potentials of the right bit line BR1 and of the left bit line BL1, and sends "1" to a data signal line D.

Next will be described the write-in operation of the memory apparatus according to the present invention when in the regular mode with reference to FIGS. 2 and 4 together. The following description concerns the operation to write "0" into the memory cell C11.

Figure 4:
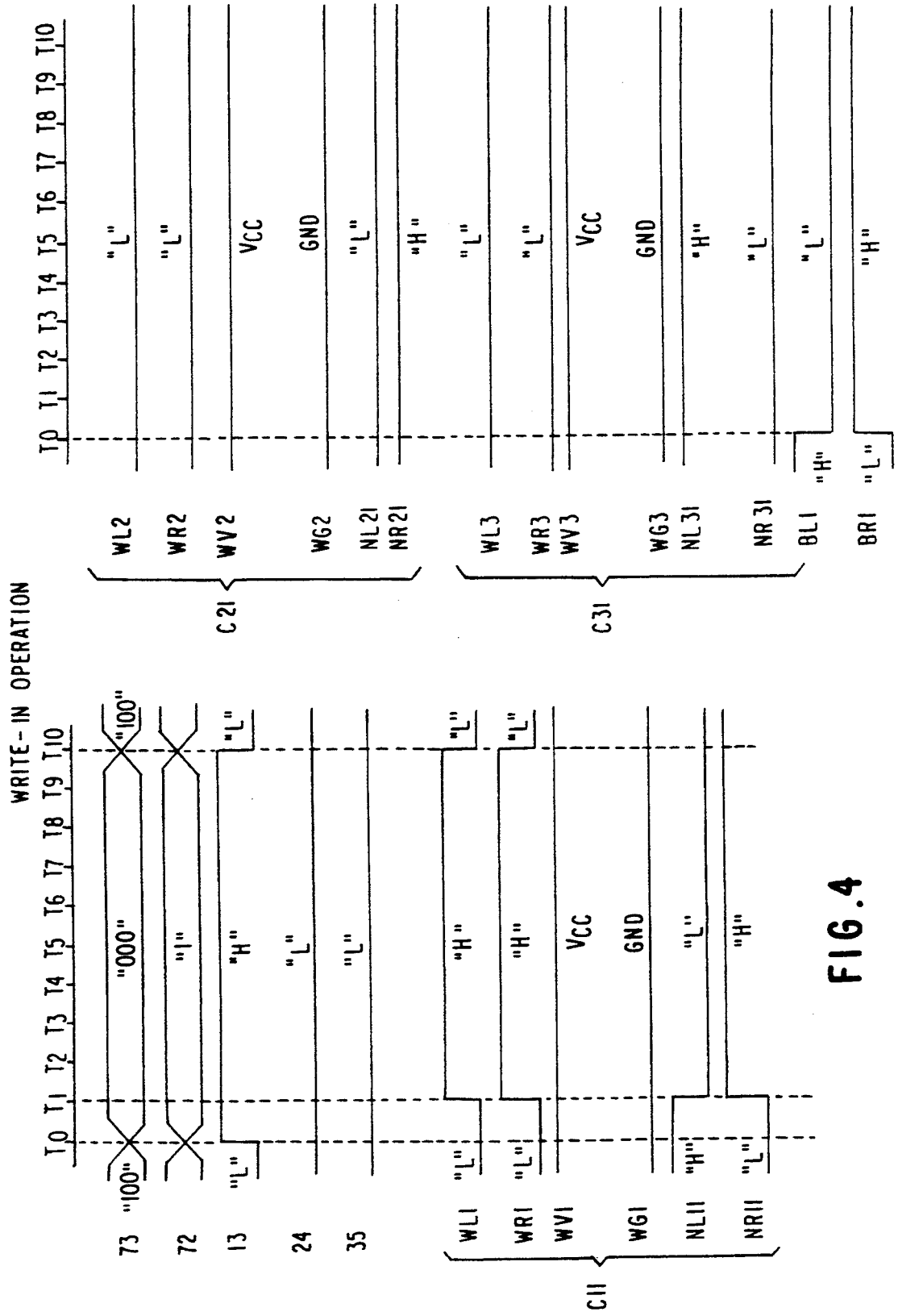
FIG. 4 is a time chart illustrating the write-in operation of the first embodiment of the invention in the regular mode.

Referring to FIG. 4, before the start of the operation, an operation mode signal AM="100" representing the ready mode is sent to the signal line 73. At time T0, the operation mode signal AM varies from the ready mode "100" to the regular mode "000", and the operation starts.

Also at time T0, a control signal CS="1" designating the write-in operation is sent to the signal line 72, a bit address BA="0" indicating the first column, to the signal line 71, and a word address WA10="00" designating the first column, to the signal line 10.

Referring to FIG. 9, the bit line selector circuit 721 in the bit control circuit 70 connects the transfer gates 731 through 743 in accordance with the bit address BA="0" received via the signal line 71. Referring to FIG. 11, since only the potential of the signal line 722 is set at "H" in this case, the left bit line BL1 is connected to the signal line 713, and the right bit line BR1 to the signal line 712. As the control signal 72 indicates the write-in operation, the I/O circuit 711 sets the left bit line BL1 to "L", and the right bit line BR1 to "H", in accordance with the write-in datum "0" sent to the data signal line D.

Referring to FIG. 13, as a result of the change of the operation mode signal AM from the ready mode "100" to the regular mode "000" at time T0, the decoder 44 in the word line control circuit 40 sets the potential of the signal line 441 at "H". The timing control circuit 45 starts its timer operation when the potential of the signal 441 has varied to "H", and controls the potentials of the timing control signal lines 451, 452 and 453 at a predetermined timing. Referring to FIG. 14, since the potential of the signal line 13 is "H" in this case, the potentials of the signal lines 451, 452 and 453 are controlled at the timing of 14-a.

Referring to FIG. 14, at time T1, the timing control circuit 45 sets the potentials of the timing control signal lines 451 and 452 at "H". Referring to FIG. 4, as a result of the change of the potential of the timing control signal line 451 to "H", the right word line control circuit 46 sets the potential of the right word line WR1 at "H". This causes the potential "L" of the right bit line BR1 to be transmitted to the right node NR11 of the memory cell C11. As a result of the change of the potential of the timing control signal line 452 to "H", the left word line control circuit 47 sets the potential of the left word line WL1 at "H". This causes the potential "H" of the left bit line BL1 to be transmitted to the left node NL11 of the memory cell 11.

At time T10, the timing control circuit 45 stops sending the timing control signals 451 and 452. This causes the potential="L" of the left node NL1 and the potential="H" of the right node NR1 to be maintained, and "0" to be stored in the memory cell C11.

Now will be described the operation of the memory apparatus according to the present invention when in the inverting operation mode with reference to FIGS. 2 and 5 together. The following description concerns the operation to store "0", which results from the inversion of the datum stored in the memory cell C11 when "1" is stored there in advance, into the memory cell C31.

Figure 5:
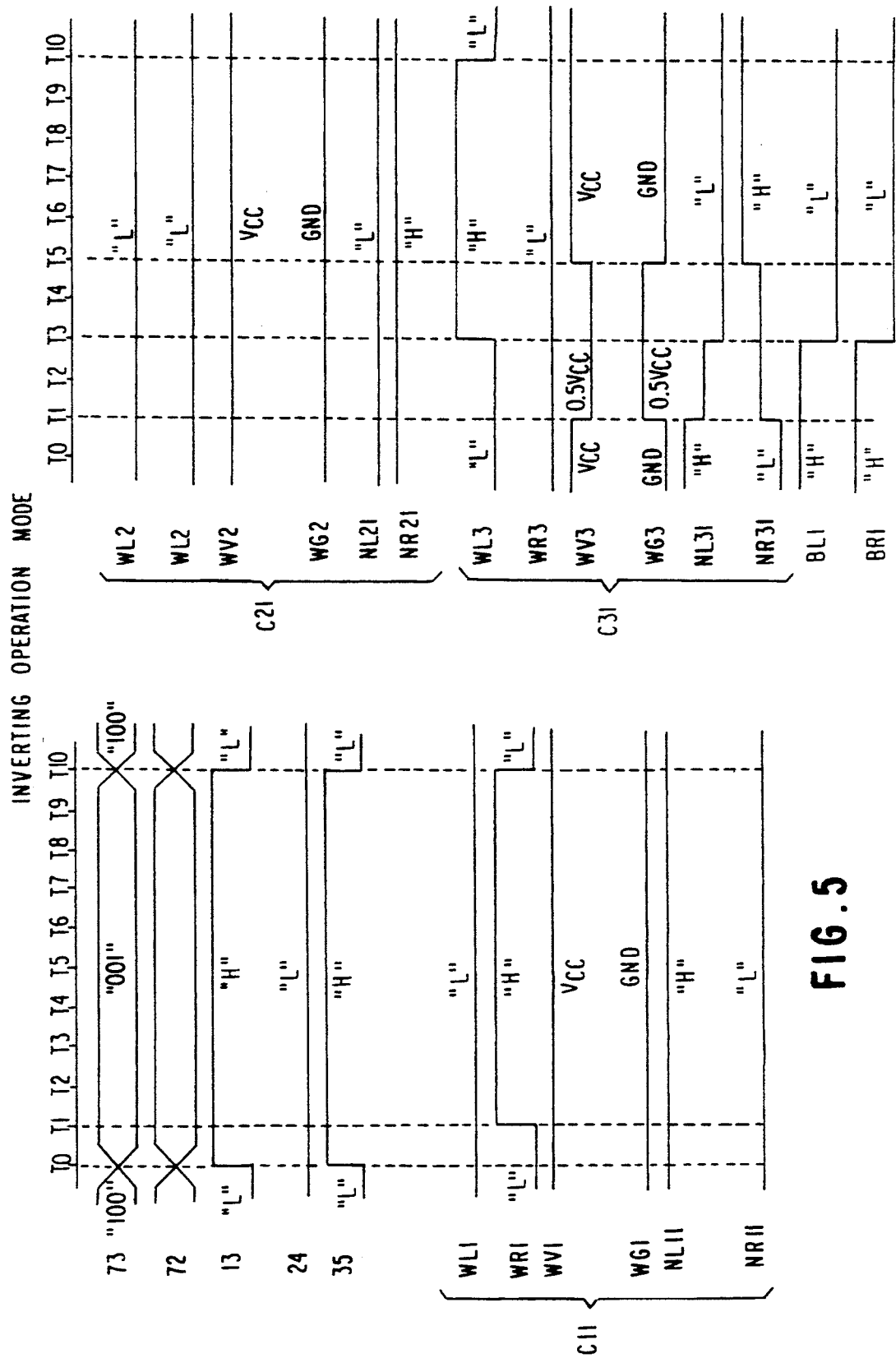
FIG. 5 is a time chart illustrating the operation of the first embodiment of the invention in the invention mode.

Referring to FIGS. 2 and 5, before the start of the operation, an operation mode signal AM="100" representing the ready mode is sent to the signal line 73. At time T0, the operation mode signal AM varies from the ready mode "100" to the inversion mode "001".

Referring to FIGS. 2 and 5, at time T0, the row on which the datum to be inverted is stored is designated by the word address WA10, and the row on which to store the inverted datum, by the word address WA30. In this case, the word address WA10="00" designating the first column is sent to the signal line 10, and the word address WA30="10" designating the third column, to the signal line 30.

Referring to FIG. 9, the bit line selector circuit 721 in the bit control circuit 70 connects the transfer gates 731 through 743 as the operation mode signal AM designates the inversion mode "001".

Referring to FIG. 11, since only the potential of the signal line 724 is set at "H" in this case, the left bit line BL1 is connected to the right bit line BR1, and the left bit line BL2 to the right bit line BR2.

Referring again to FIGS. 2 and 5, at time T0, the word address decoder 12, which has received the word address WA10="00" via the signal line 10, decodes "00". As a result, the word address decoder 12 sends the selection signal SS13 by setting the potential of the signal line 13 at "H". Also at time T0, the word address decoder 32, which has received the word address WA30="10" via the signal line 30, decodes "10". As a result, the word address decoder 32 sends the selection signal SS35 by setting the potential of the signal line 35 at "H".

Referring to FIG. 13, as a result of the change of the operation mode signal AM from the ready mode "100" to the inversion mode "001" at time T0, the decoder 44 in the word line control circuit 40 sets the potential of the signal line 442 at "H". The timing control circuit 45 starts its timer operation when the potential of the signal 442 has varied to "H", and controls the potentials of the timing control signal lines 451, 452 and 453 at a predetermined timing. Referring to FIG. 14, since the potential of the signal line 13 is "H" in this case, the potentials of the signal lines 451, 452 and 453 are sent at the timing of 14-d. The potentials of the left word line WL1, the right line WR1, the world power supply line WV1 and the ground line WG1 are controlled in accordance with the potentials of the timing control signal lines 451, 452 and 453.

Further at time T0, like the word line control circuit 40, the word line control circuit 60 also starts its timer operation, and controls the potentials of the left word line WL3, the right word line WR3, the power supply WV3 and the ground line WG3. Referring to FIG. 14, since the operation mode is for inversion and the potential of the signal line 35 is at "H", the potentials of the signal lines 451, 452 and 453 are controlled at the timing of 14-f.

Referring to FIGS. 2 and 5, at time T1, the right word line control circuit 40 sets the potential of the right word line WR1 at "H". This causes the potential "L" of the right node NR11 of the memory cell C11 to be transmitted to the right bit line BR1 and the left bit line BL1. It is because the left bit line BL1 and the right bit line BR1 are connected by the bit control circuit 70 that not only the potential of the right bit line BR1 but also that of the left bit line BL1 varies.

Further at time T1, the word line control circuit 60 changes the potentials of both the power supply line WV3 and the ground line WG3 to 0.5 Vcc, and equalizes the potentials of the power supply line WV3 and of the ground line WG3. This inactivates the memory cell C11 to delete its previously stored content.

At time T3, the word line control circuit 60 sets the potential of the left word line WL3 at "H". This causes the potential "L" of the left bit line BL1 to be transmitted to the left node NL31 of the memory cell C31. Thus, the potential at the right node NR11 of the memory cell C11 is transmitted to the left node NL31 of the memory cell C31. In other words, the inverted potential at the left node NL11 of the memory cell C11 becomes the potential at the left node NL31 of the memory cell C31.

At time T5, the word line control circuit 60 returns the potential of the power supply line WV3 to Vcc and that of the ground line WG3 to GND. At this time, since the potential of the left node NL31 of the memory cell C31 is lower than that of the right node NR31, "0" is held by the memory cell C31.

At time T10, the word line control circuit 40 returns the potential of the right word line WR1 to "L" , and the word line control circuit 60 also returns that of the left word line WL3 to "L". This severs the memory cell C31 from the left bit line BL1 and from the right bit line BR1, and in the memory cell C31 is stored "0", which derives from the inversion of "1" stored in the memory cell C11.

Also at time T10, the operation mode signal AM is returned to the ready mode="100", and the potentials of the signal lines 13 and 35 and the left word line WL3 are also returned to "L". This ends the operation in the inversion mode.

The above-described operation takes place not only on the first column of the memory cell array CA but simultaneously on its second column. Thus, when the above-described operation ends, the inverted content of the memory cell C12 will have been written into the memory cell C32. Therefore, this operation causes the invertion of the contents stored on the first row of the memory cell array CA to be operated in parallel and to be simultaneously written into the third row of the memory cell array CA.

Next will be described the operation of the memory apparatus according to the present invention in the OR mode with reference to FIGS. 2 and 6. The following description concerns the operation to store "0", which is the OR of the stored content "1" of the memory cell C11 and of the stored content "0" of the memory cell C12 when "1" and "0" are respectively stored in the memory cells C11 and C12 in advance, into the memory cell C31.

Figure 6:
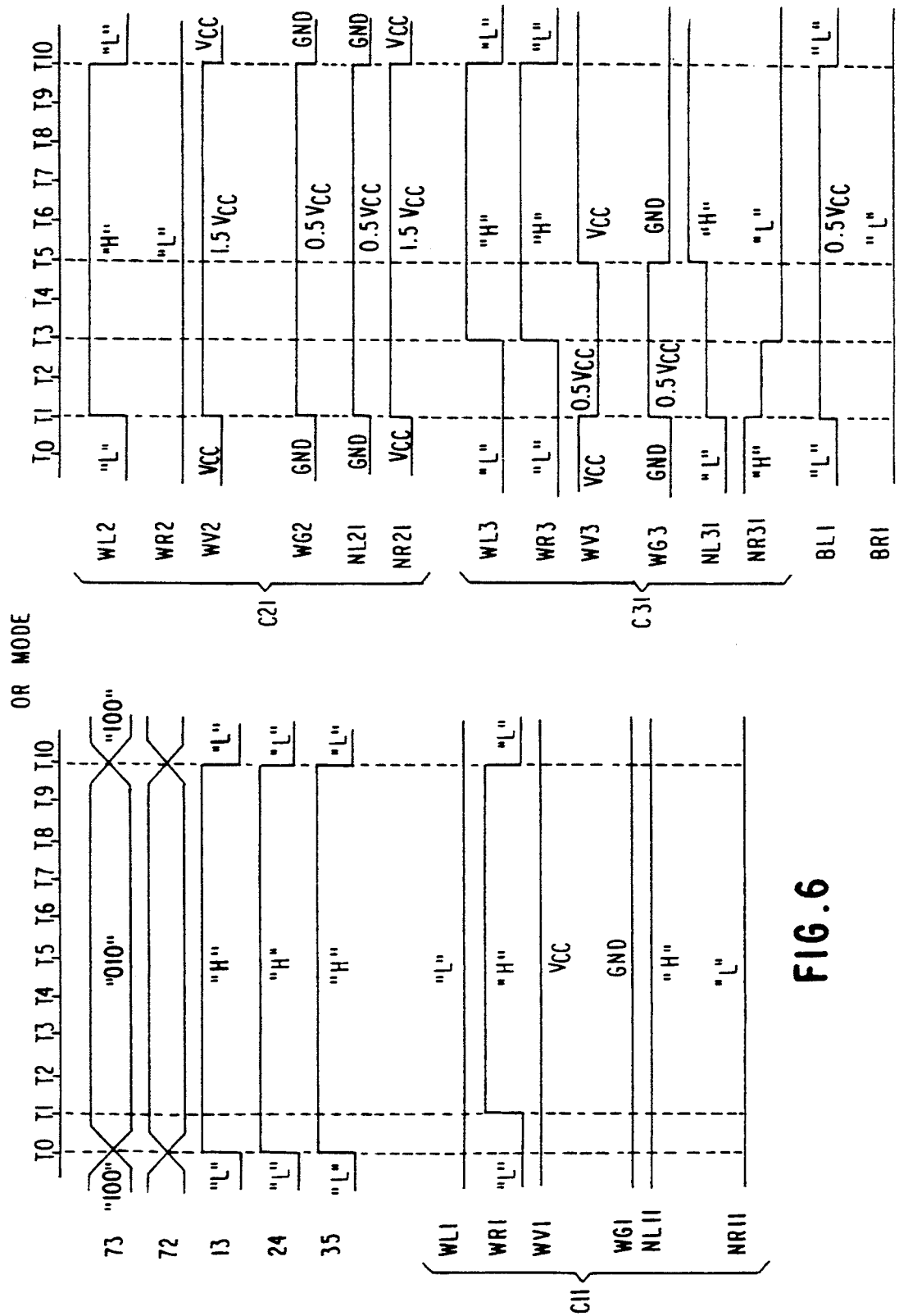
FIG. 6 is a time chart illustrating an operation of the first embodiment of the invention in the OR mode.

Referring to FIGS. 2 and 6, before the start of the operation, an operation mode signal AM="100" representing the ready mode is sent to the signal line 73. At time T0, the operation mode signal AM varies from the ready mode "100" to the OR mode "010".

At time T0, two rows on which the data to be subjected to the OR operation are stored are designated by the word addresses WA10 and WA20. The row on which the resultant OR is to be stored is designated by the word address WA30. In this case, the word address WA10="00" designating the first column is sent to the signal line 10, the word address W20="01" designating the second column, to the signal line 20, and the word address WA30="10" designating the third column, to the signal line 30.

Referring to FIG. 11, the bit line selector circuit 721 in the bit control circuit 70 does not connect the transfer gates 731 through 743 as the operation mode signal AM designates the OR mode "010".

Referring again to FIGS. 2 and 5, at time T0, the word address decoder 12, which has received the word address WA10="00" via the signal line 10, decodes "00". Referring to FIG. 6, as a result, the word address decoder 12 sends the selection signal SS13 by setting the potential of the signal line 13 at "H". Also at time T0, the word address decoder 22, which has received the word address WA20="01" via the signal line 20, decodes "01". Further at time T0, the word address decoder 32, which has received the word address WA30="10" via the signal line 30, decodes "10". As a result, the word address decoder 32 sends the selection signal SS35 by setting the potential of the signal line 35 at "H".

At time T0, as a result of the change of the operation mode signal AM to the OR mode, the word line control circuit 40 starts its timer operation, and controls the potentials of the left word line WL1, the right word line WR1, the power supply line WV1 and the ground line WG1. Referring to FIG. 14, since the operating mode is the OR mode and the potential of the signal line 13 is "H" in this case, the potentials of the left word line WL1, the right word line WR1, the power supply line WV1 and the ground line WG1 are controlled at the timing of 14-g.

At time T0, as a result of the change of the operation mode signal AM to the OR mode, the word line control circuit 50 starts its timer operation, and controls the potentials of the left word line WL2, the right word line WR2, the power supply line WV2 and the ground line WG2. Referring to FIG. 14, since the operating mode is the OR mode and the potential of the signal line 24 is "H" in this case, the potentials of the left word line WL2, the right word line WR2, the power supply line WV2 and the ground line WG2 are controlled at the timing of 14-h.

At time T0, as a result of the change of the operation mode signal AM to the OR mode, the word line control circuit 60 starts its timer operation, and controls the potentials of the left word line WL3, the right word line WR3, the power supply line WV3 and the ground line WG3. Referring to FIG. 14, since the operating mode is the OR mode and the potential of the signal line 35 is "H" in this case, the potentials of the left word line WL3, the right word line WR3, the power supply line WV3 and the ground line WG3 are controlled at the timing of 14-i.

Referring to FIGS. 2 and 6, at time T1, the right word line control circuit 40 sets the potential of the right word line WR1 at "H". This causes the potential GND of the right node NR11 of the memory cell C11 to be transmitted to the right bit line BR1.

Also at time T1, the word line control circuit 50 sets the voltages of the power supply line WV2 and the ground line WG2 at 1.5 Vcc and 0.5 Vcc, respectively. This causes the potential of the left node NL21 of the memory cell C21 to rise from "L"=GND to 0.5 Vcc, and that of the right node NR21 from "H"=Vcc to 1.5 Vcc. At time T1, the word line control circuit 50 also sets the potential of the left word line WL2 at "H". This causes the potential 0.5 Vcc of the left node NL21 of the memory cell C21 to be transmitted to the left bit line BL1.

Further at time T1, the word line control circuit 60 sets the potentials of the power supply line WV3 and the ground line WG3 at 0.5 Vcc. This inactivates the memory cell C11 to delete its content stored before time T1.

At time T3, the word line control circuit 60 sets the potential of the left word line WL3 at "H". This causes the potential Vcc of the left bit line BL1 to be transmitted to the left word line WL31 of the memory cell C31. Also at time T3, the word line control circuit 60 sets the potential of the right word line WR3 at "H". This causes the potential GND of the right bit line BR1 to be transmitted to the right word line WR31 of the memory cell C31.

At time T5, the word line control circuit 60 returns the potentials of the power supply line WV3 and of the ground line WG3 to Vcc and GND, respectively. At this time, since the potentials of the left node NL31 and of the right node NR31 are Vcc and GND, respectively, and the potential of the left node NL31 of the memory cell C31 is higher than that of the right node NR31, the potentials of the left node NL31 and of the right node NR31 become Vcc="H" and GND="L", respectively.

At time T10, the word line control circuit 60 returns the potentials of the left word line WL3 and of the right word line WR3 to "L". Since the potential of the left node NL31 is "H" and that of the right node NR31 is "L", the OR "1" of the content "1" stored in the memory cell 11 and of the content "0" stored in the memory cell C21 is stored into the memory cell 31.

Also at time T10, the operation mode signal AM is returned to the ready mode="100", and the potentials of the signal lines 13, 14 and 35, the right word line WR1, the left word line WL2, the left word line WL3 and the right word line WR3 are returned to "L", and the potentials of the power supply line WV2 and of the word ground line WG2 are returned to Vcc and GND, respectively. This ends the operation in the OR mode.

Figure 7:
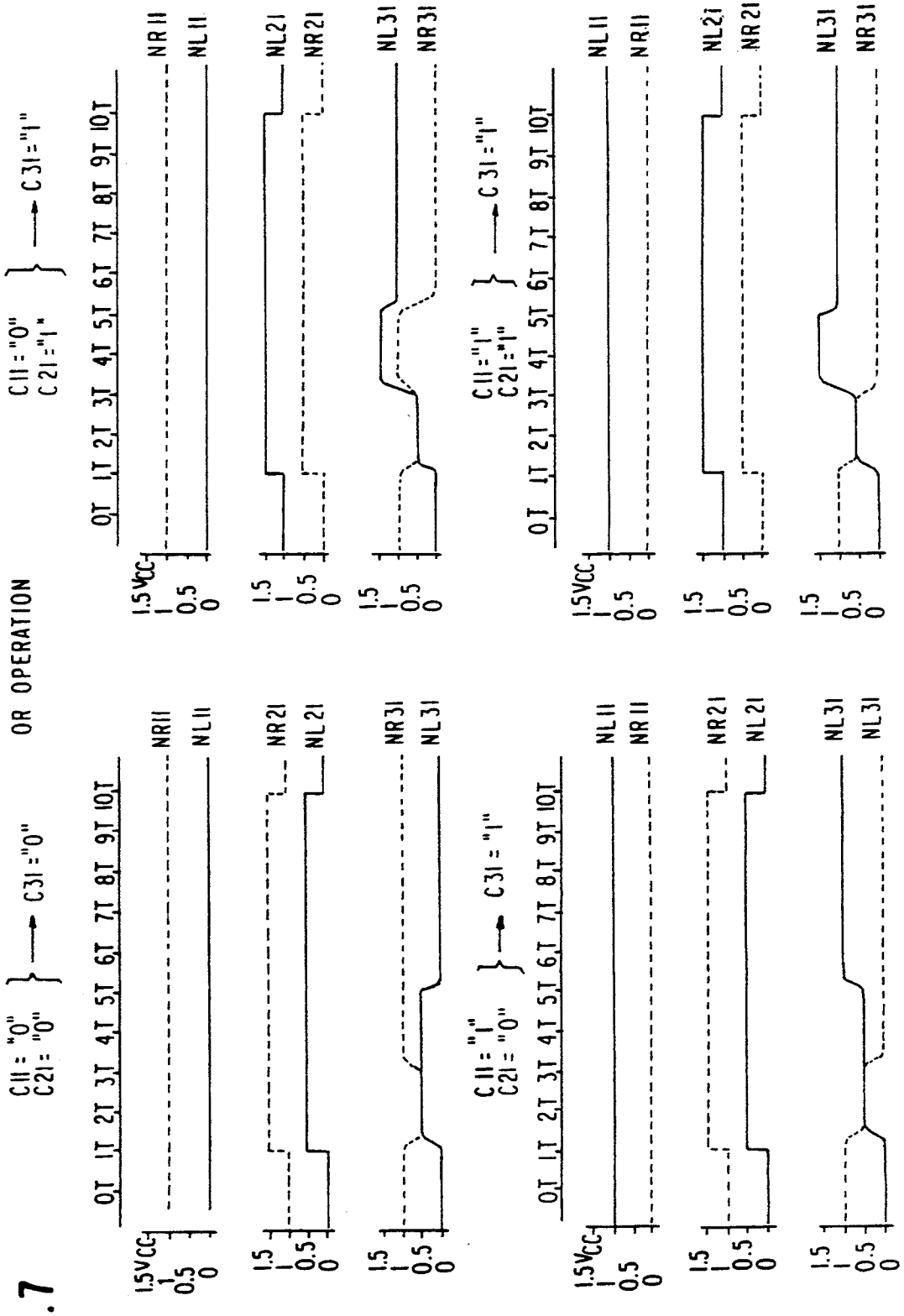
FIG. 7 is a time chart illustrating another operation of the first embodiment of the invention in the OR mode.

While the above-described operation referred to a case in which the values of the memory cells C11 and 21 are "1" and "0", respectively, this memory apparatus, which is a preferred embodiment of the present invention, can also execute accurate OR operation when the memory cells C11 and C21 have other values. A time chart referring to cases other than the combination of the memory cell C11="1" and the memory cell C21="0" is shown in FIG. 7. In every case, whichever of the left node NL31 and the right node NR31 has a higher potential than the other at time T5 is set at "H" at time T10, and this enables correct OR operation to be accomplished. To describe a case in which the value of C11 is "0" and that of C21 is "1" for example, the potential of the left node NL31 is 1.5 Vcc, which is the potential of the left node NL21, and the potential of the right node NR31 is Vcc, which is the potential of the right node NR11, at time T5. Since the potential of the left node NL31 is higher than that of the right node NR31 at this time, the potentials of the left node NL31 and of the right node NR31 become "H" and "L", respectively, at time T6, and "1" is written into the memory cell C31. This is equal to the OR "1" of the content "0" stored in the memory cell 11 and the content "1" stored in the memory cell C21.

The above-described operation takes place not only on the first column of the memory cell array CA but simultaneously on its second column. Thus, when the above-described operation ends, the OR of the content stored in the memory cell C12 and of that stored in the memory cell C22 will have been written into the memory cell C32. Therefore, this operation causes the OR operation of the content stored on the first row of the memory cell array CA and that of the content stored on its second row to be accomplished in parallel and the results to be simultaneously written into on each cell of the third row of the memory cell array CA.

Now will be described the operation of the memory apparatus according to the present invention when in the inverted shift mode with reference to FIGS. 2 and 8 together. The following description concerns the operation to shift rightward by one bit "0", which results from the inversion of the datum stored in the memory cell C11 when "1" is stored there in advance, and store it into the memory cell C23.

Figure 8:
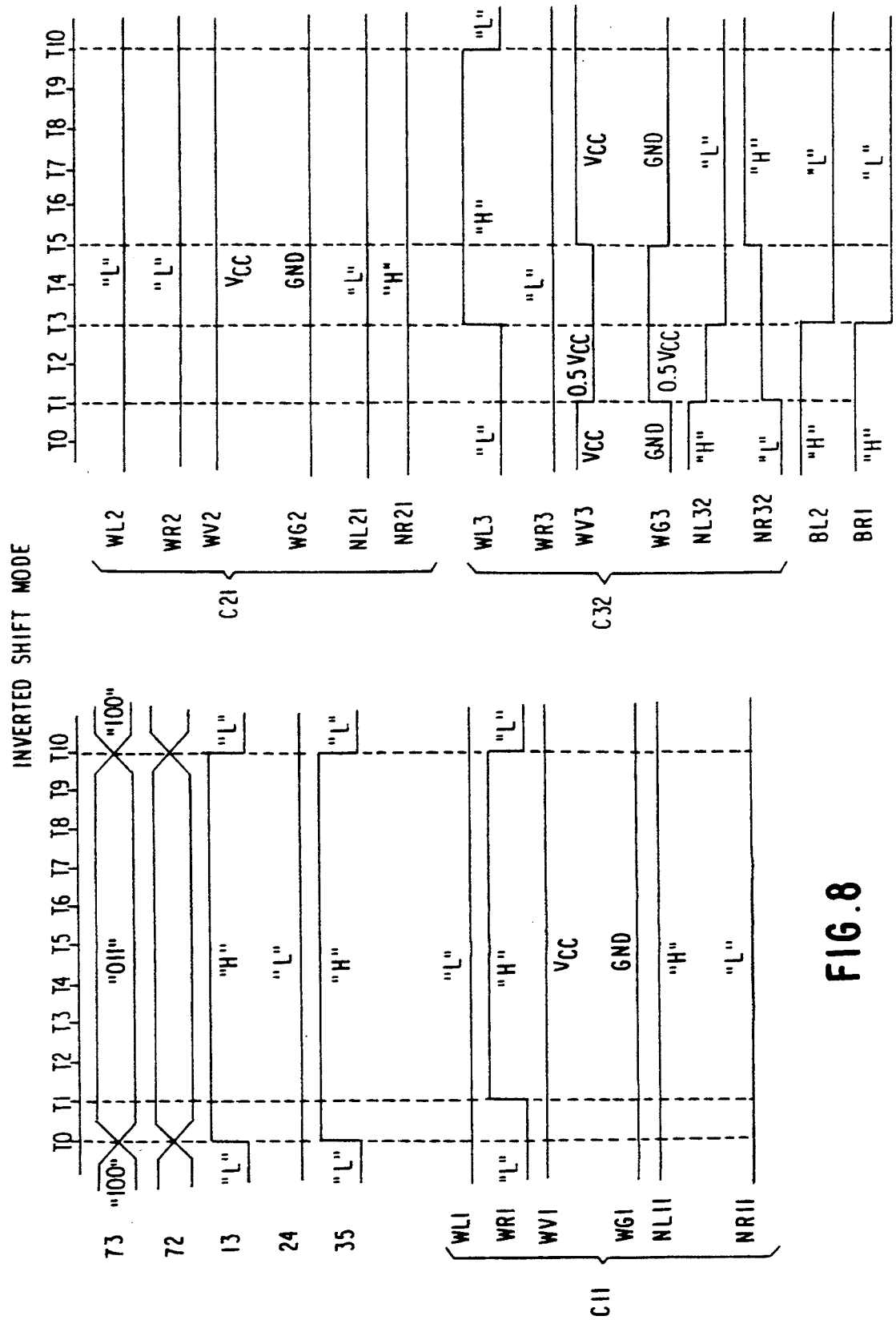
FIG. 8 is a time chart illustrating the operation of the first embodiment of the invention in the inverted shift mode.

Referring to FIGS. 2 and 8, before the start of the operation, an operation mode signal AM="100" representing the ready mode is sent to the signal line 73. At time T0, the operation mode signal AM varies from the ready mode "100" to the inverted shift mode "011".

At time T0, the row on which the datum to be subjected to inverted shift is stored is designated by the word address WA10, and the row on which to store the invert-shifted datum, by the word address WA30. In this case, the word address WA10="00" designating the first row is sent to the signal line 10, and the word address WA30="10" designating the third row, to the signal line 30.

Referring to FIG. 9, the bit line selector circuit 721 in the bit control circuit 70 connects the transfer gates 731 through 743 as the operation mode signal AM designates the inversion mode "001". Referring to FIG. 11, since the potential of the signal line 725 is set at "H" in this case, the right bit line BR1 and the left bit line BL2 are connected to each other.

Referring again to FIGS. 2 and 5, at time T0, the word address decoder 12, which has received the word address WA10="00" via the signal line 10, decodes "00". As a result, the word address decoder 12 sends the selection signal SS13 by setting the potential of the signal line 13 at "H". Also at time T0, the word address decoder 32, which has received the word address WA30="10" via the signal line 30, decodes "10". As a result, the word address decoder 32 sends the selection signal SS35 by setting the potential of the signal line 35 at "H".

As a result of the change of the operation mode signal AM to the inverted shift mode at time T0, the word line control circuit 40 starts its timer operation, and controls the potentials of the left word line WL1, the right line WR1, the power supply line WV1 and the ground line WG1. Referring to FIG. 14, since the operation mode is the inverted shift mode and the potential of the signal line 13 is "H" in this case, the potentials of the left word line WL1, the right word line WR1, the power supply line WV1 and the ground line WG1 are controlled at the timing of 14-j.

As a result of the change of the operation mode signal AM to the inverted shift mode at time T0, the word line control circuit 60 starts its timer operation, and controls the potentials of the left word line WL3, the right line WR3, the power supply line WV3 and the ground line WG3. Referring to FIG. 14, since the operation mode is the inverted shift mode and the potential of the signal line 35 is "H" in this case, the potentials of the left word line WL3, the right word line WR3, the power supply line WV3 and the ground line WG3 are controlled at the timing of 14-l.

Referring to FIGS. 2 and 5, at time T1, the right word line control circuit 40 sets the potential of the right word line WR1 at "H". This causes the potential "L" of the right node NR11 of the memory cell C11 to be transmitted to the right bit line BR1 and the left bit line BL2. It is because the left bit line BL1 and the right bit line BR2 are connected by the bit control circuit 70 that not only the potential of the right bit line BR1 but also that of the left bit line BLZ varies.

Further at time T1, the word line control circuit 60 changes the potentials of the power supply line WV3 and the ground line WG3 to 0.5 Vcc, and equalizes the potentials of the power supply line WV3 and of the ground line WG3. This inactivates the memory cell C11 to delete its previously stored content.

At time T3, the word line control circuit 60 sets the potential of the left word line WL3 at "H". This causes the potential "L" of the left bit line BL2 to be transmitted to the left node NL32 of the memory cell C32. Thus, the potential at the right node NR11 of the memory cell C11 is transmitted to the left node NL32 of the memory cell C32. In other words, the inverted potential at the left node NL11 of the memory cell C11 becomes the potential at the left node NL32 of the memory cell C32.

At time T5, the word line control circuit 60 returns the potential of the power supply line WV3 to Vcc and that of the ground line WG3 to GND. At this time, since the potential of the left node NL32 of the memory cell C32 is lower than that of the right node NR32, "0" is held by the memory cell C32.

At time T10, the word line control circuit 40 returns the potential of the right word line WR1 to "L", and the word line control circuit 60 also returns that of the left word line WL3 to "L". This severs the memory cell C32 from the left bit line BL2 and from the right bit line BR2, and in the memory cell C32 is stored "0", which derives from the inversion of "1" stored in the memory cell C11. Thus, into the third row of the memory cell array CA is written a value resulting from the inversion of the value stored on the first row and the rightward shift of the inverted value by one bit.

At time T10, the operation mode signal AM is returned to the ready mode="100", and the potentials of the signal lines 13 and 35, the right word line WR1 and the left word line WL3 are also returned to "L". This ends the operation in the inverted shift mode.

While this preferred embodiment has been described with reference to a case in which the memory cell array CA has two columns, the above-described operation takes place not only on the first column of the memory cell array CA but similarly on its second and subsequent columns as well where the memory cell array CA has more than two columns. Therefore, the inverted content of the second column of the the memory cell array CA is shifted rightward by one bit, and simultaneously written into the cells of the third column of the memory cell array CA.

Furthermore, while this embodiment has been described with reference to a case of inverted shift rightward, the content stored on the third row of the memory cell array CA can be inverted and shifted leftward by one bit to be written into the cells of the first row of the memory cell array CA if the first row is designated by the word address WA30 and the third row, by the word address WA10.

Although the above-described embodiment is supposed to send the word addresses WA10, WA20 and WA30 over the signal lines 10, 20 and 30, respectively, the number of signal lines can be reduced by having one of these three signal lines also serve as the signal line 71 for sending the bit address BA.

Furthermore, although each operation started with a change of the operating mode signal AM in the above-described embodiment, a signal to instruct the start of each operation may be supplied from outside as well. The timing control signals 451, 452 and 453 to be sent by the timing control circuit 45 can also be supplied from outside.

As hitherto described, the memory apparatus, which is a preferred embodiment of the present invention, can subject the content of any row of the memory cell array CA to inversion, OR operation or inverted shift operation, and write the result into any row of the memory cell array CA. Therefore, by appropriately combining these operations, any desired type of operation can be accomplished between any combination of cells. In the regular mode, this memory apparatus can execute read-out and write-in operations as any conventional SRAM apparatus does.

Although the memory cell CA in the embodiment described above is supposed to have three rows by two columns for the convenience of description, memory cell array CA may have any number of columns and rows. Should the memory cell array CA have, for instance, 1,000 rows by 4,000 columns, operations on the contents of the 4,000 cells of any row in the memory cell array CA can be executed in parallel, and the results can be simultaneously written into the cells of another column of the memory cell array CA. In other words, 4,000 logic operations can be executed in parallel. Further, if a plurality of such memory apparatuses are used in parallel, the number of operations that can be executed at a time can be indefinitely increased.

In this embodiment, the logic operation between memory cells and the write-in operation of the result of operation take place only within the memory cell array CA. Accordingly, there is no need to provide holding means for temporarily holding the contents of memory cells outside. Furthermore, since this embodiment need not transfer the contents of memory cells to the outside, it can execute any operation at high speed.

Moreover, this embodiment requires only one word line control circuit and one word address decoder for each row of the memory cell array CA, but need not have a logic operation element for each cell. As a result, the memory apparatus, which is a preferred embodiment of the invention, can consist of a smaller number of elements than a logic-in-memory according to the prior art. Therefore, when this memory apparatus is composed into an IC, the size of the IC chip can be reduced. Or, if the chip size is the same, it can enable the chip to have a greater storage capacity than a logic-in-memory chip.

Furthermore, this embodiment can execute three different operations including inversion, OR and inverted shift with the same configuration. Thus, it requires a smaller number of elements, resulting in a higher degree of integration. As a result, if this memory apparatus is subjected to large scale integration, a greater number of memory cells can be built into the same area.

What is claimed is:

1. A memory apparatus comprising:
  (A) an array of a plurality of memory cells,
    (i) said memory cells including
      (a) a first transistor for receiving the potential of a left word line to connect a left bit line with said memory cell,
      (b) a second transistor for receiving the potential of a right word line controlled independently of said left word line to connect a right bit line with said memory cell,
      (c) a power supply terminal for receiving a source voltage from a power supply line, and
      (d) a ground terminal for receiving a ground voltage from a ground line,
    (ii) said array comprising a plurality of rows of said memory cells and a plurality of columns of said memory cells,
      (a) said plurality of rows including at least a first and second row, said first and second rows comprising a first and second sequence of said memory cells, respectively, and (b) said plurality of columns including at least a first and second column, said first and second columns comprising a third and fourth sequence of said memory cells, respectively;

(B) a plurality of said left word lines including at least a first left word line and a second left word line;

(C) a plurality of said right word lines including at least a first right word line and a second right word line;

(D) a plurality of said left bit lines including at least a first left bit line and a second left bit line;

(E) a plurality of said right bit lines including at least a first right bit line and a second right bit line;

(F) a plurality of said power supply lines including at least a first and a second power supply line;

(G) a plurality of said ground lines including at least a first ground line and a second ground line;

(H) a bit line control circuit; and (I) a plurality of word line control circuits, including at least a first word line control circuit and a second word line control circuit;

in which each of said first sequence of memory cells is connected to (i) said first left word line, (ii) said first right word line, (iii) said first power supply line, and (iv) said first ground line, each of said second sequence of memory cells is connected to (i) said second left word line, (ii) said second right word line, (iii) said second power supply line, and (iv) said second ground line, each of said third sequence of memory cells is connected to said first left bit line and to said first right bit line, and each of said fourth sequence of memory cells is connected to said second left bit line and to said second right bit line.

2. The memory apparatus of claim 1, in which said bit line control circuit controls the potentials of said plurality of memory cells by controlling the potentials of said plurality of left and right bit lines connected to said plurality of memory cells;

said first word line control circuit is provided for said first row to control the potentials of said first left word line, said first right word line, said first power supply line, and said first ground line; and said second word line control circuit is provided for said second row to control the potentials of said second left word line, said second right word line, said second power supply line, and said second ground line.

3. The memory apparatus of claim 1, in which said bit line control circuit receives a mode control signal for controlling the potentials of said plurality of memory cells by controlling the potentials of said plurality of left and right bit lines connected to said plurality of memory cells;

said first word line control circuit is provided for said first row and receives said mode control signal for controlling the potentials of said first left word line, said first right word line, said first power supply line, and said first ground line; and said second word line control circuit is provided for said second row and receives said mode control signal for controlling the potentials of said second left word line, said second right word line, said second power supply line, and said second ground line.

4. The memory apparatus of claim 3, further comprising:

a first word address decoder capable of receiving a first word address for generating and supplying a first selection signal to at least said first and second word line control circuits; and a second word address decoder capable of receiving a second word address for generating and supplying a second selection signal to at least said first and second word line control circuits.

5. The memory apparatus of claim 4, further comprising inverting operation control means for:

causing said bit line control circuit to connect said first right bit line and said first left bit line;

causing said first word line control circuit, when selected by said first word address decoder, to set the potential of said first left word line at a high level;

causing said second word line control circuit, when selected by said second word address decoder, to set the potential of said second right word line at the high level; and causing said second word line control circuit to temporarily equalize the potential of said second power supply line and that of said second ground line.

6. The memory apparatus of claim 4, in which said second column is located immediately next to said first column, and further comprising inverted shift operation control means for:

causing said bit line control circuit to connect said first right bit line and said second left bit line;

causing said first word line control circuit, when selected by said first word address decoder, to set the potential of said first left word line at a high level;

causing said second word line control circuit, when selected by said second word address decoder, to set the potential of said second right word line at the high level; and causing said second word line control circuit to temporarily equalize the potential of said second power supply line and that of said second ground line.

7. The memory apparatus of claim 4, further comprising a third word address decoder capable of receiving a third word address for supplying a third selection signal to a third word line control circuit of said plurality of word line control circuits.

8. The memory apparatus of claim 7, in which said plurality of said left word lines further includes at least a third left word line;

said plurality of said right word lines further includes at least a third right word line;

said plurality of said power supply lines further includes at least a third power supply line;

said plurality of said ground lines further includes at least a third ground line;

and further comprising OR operation control means for:

causing said bit line control circuit to disconnect said first right bit line and said first left bit line;

causing said first word line control circuit, when selected by said first word address decoder, to set the potential of said first right word line at said high level;

causing said second word line control circuit, when selected by said second word address decoder, to set the potential of said second left word line at the high level;

causing said second word line control circuit to temporarily raise the potential of said second power supply line and that of said second ground line;

causing said third word line control circuit, when selected by said third word address decoder, to set the potential of said third left and right word lines to said high level, and temporarily equalize the potential of said third power supply line and that of said third ground line.

* * * * *